United States Patent
Guerrieri et al.

(10) Patent No.: US 9,325,450 B2
(45) Date of Patent: Apr. 26, 2016

(54) METHOD AND SYSTEM FOR PROCESSING DIGITAL DATA, CORRESPONDING APPARATUS AND COMPUTER PROGRAM PRODUCT

(71) Applicant: STMicroelectronics S.r.l., Agrate Brianza (IT)

(72) Inventors: Lorenzo Guerrieri, Aosta (IT); Paola Bisaglia, Padua (IT); Maurizio Martina, Turin (IT); Guido Masera, Turin (IT)

(73) Assignee: STMicroelectronics S.r.l., Agrate Brianza (IL)

( * ) Notice: Subject to any disclaimer, the term of this patent is extended or adjusted under 35 U.S.C. 154(b) by 0 days.

(21) Appl. No.: 14/667,147

(22) Filed: Mar. 24, 2015

(65) Prior Publication Data
US 2015/0341142 A1 Nov. 26, 2015

(30) Foreign Application Priority Data

May 21, 2014 (IT) .............................. TO2014A0402

(51) Int. Cl.
*H03D 1/00* (2006.01)
*H04L 27/06* (2006.01)
*H04L 1/00* (2006.01)
(Continued)

(52) U.S. Cl.
CPC ......... *H04L 1/0054* (2013.01); *H03M 13/3927* (2013.01); *H03M 13/6502* (2013.01); *H03M 13/6586* (2013.01); *H04L 1/0058* (2013.01); *H04L 1/0059* (2013.01)

(58) Field of Classification Search
CPC ..... H04L 1/006; H04L 1/0054; H04L 1/0065; H04L 1/0071; H04L 1/0041
USPC .................................. 375/259–285, 316–352
See application file for complete search history.

(56) References Cited

U.S. PATENT DOCUMENTS

| | | | | |
|---|---|---|---|---|
| 6,725,409 B1 * | 4/2004 | Wolf | ................. | H03M 13/2957 714/755 |
| 6,775,801 B2 * | 8/2004 | Wolf | ................. | H03M 13/2957 375/262 |

(Continued)

FOREIGN PATENT DOCUMENTS

EP 1 314 071 A2 5/2003

OTHER PUBLICATIONS

Bahl et al., "Optimal decoding of linear codes for minimizing symbol error rate," IEEE Transactions on Information Theory, vol. 20, No. 3, pp. 284-287, Mar. 1974.
Berrou et al. "Near Shannon limit error correcting coding and decoding: Turbo codes," IEEE International Conference on Communications, pp. 1064-1070, 1993.

(Continued)

*Primary Examiner* — James M Perez
(74) *Attorney, Agent, or Firm* — Seed IP Law Group PLLC

(57) ABSTRACT

Digital data signals such as, e.g., turbo-encoded data signals subject to decoding, are processed by producing a plurality of families of metrics for these signals while allowing one or more of these metrics to wrap through a respective independent wrapping operation. A decoder, e.g., a decoder for turbo-encoded digital signals computes differences of metrics selected out of the plurality of families of metrics by excluding differences of metrics derived through independent wrapping operations (e.g., wrapping metrics from different families) and generates signals representative of order relationships of combinations of corresponding unwrapped metrics as a function of said differences.

21 Claims, 8 Drawing Sheets

(51) Int. Cl.
*H03M 13/39* (2006.01)
*H03M 13/00* (2006.01)

(56) References Cited

U.S. PATENT DOCUMENTS

| | | | | |
|---|---|---|---|---|
| 8,566,687 | B1* | 10/2013 | Eliaz | H04L 25/03178 375/261 |
| 8,588,347 | B1* | 11/2013 | Petrovic | H04L 1/08 375/260 |
| 2003/0084393 | A1 | 5/2003 | Wolf et al. | |
| 2003/0103584 | A1* | 6/2003 | Bjerke | H04L 1/0003 375/340 |
| 2003/0225548 | A1 | 12/2003 | Gunther et al. | |
| 2010/0070819 | A1* | 3/2010 | Stein | H03M 13/2957 714/752 |

OTHER PUBLICATIONS

Fanucci et al., "VLSI design of a high speed turbo decoder for 3rd generation satellite communication," Electronics, Circuits and Systems—9th International Conference, vol. 2, pp. 509-512. Sep. 2002.
Hekstra, "An alternative to metric resealing in Viterbi decoders," IEEE Transactions on Communications, vol. 37, No. 11, pp. 1220-1222, Nov. 1989.
Masera et al., "VLSI Architectures for Turbo Codes," IEEE Transactions on Very Large Scale Integration (VLSI) Systems, vol. 7, No. 3, Sep. 1999.
Montorsi et al., "Design of Fixed-Point Iterative Decoders for Concatenated Codes with Interleavers," IEEE Journal on Selected Areas in Communications, vol. 19, No. 5, May 2001.
Worm et al., "Advanced implementation issues of turbo-decoders," International Symposium on Turbo Codes and Related Topics, XP009028944, pp. 351-354, Sep. 2000.

* cited by examiner

METHOD AND SYSTEM FOR PROCESSING DIGITAL DATA, CORRESPONDING APPARATUS AND COMPUTER PROGRAM PRODUCT

BACKGROUND

1. Technical Field

The present description relates to techniques for processing digital data.

One or more embodiments may apply to communication systems involving decoding of, e.g., convolutional codes.

One or more embodiments may apply to decoding convolutional codes and, as a consequence, turbo codes.

2. Description of the Related Art

In the design of digital systems, a fixed point representation may be adopted and one of the issues for the digital designer may be dimensioning, e.g., selecting the number of bits which may represent a particular quantity appearing in a procedure considered. This choice may be significant, as implementation complexity, dissipated energy and processing delay tend to grow with the number of bits, while the quality of the generated results may be degraded by a low number of allocated bits. In certain procedures, e.g., those organized in an iterative way, the dynamics of some quantities may evolve through the execution of the procedure: in these cases, dimensioning may be more difficult.

In certain cases, these quantities may be used for discrimination purposes, e.g., the values they assume may be compared with the values of other quantities or by a constant.

An order relationship may thus be present, and these quantities may be referred to as "metrics".

The management of metrics may be important, e.g., in digital communication systems. There, channel encoding may be adopted at the transmitter side to protect the information transmitted from effects of the transmission channel. Repetition codes, block codes, convolutional codes, turbo codes and LDPC codes are exemplary of channel coding schemes. At the receiver side, channel decoding procedures may reconstruct the transmitted information.

Channel decoding procedures may use internal metrics to provide reliability information as regards the information transmitted, an objective being to discriminate the one message actually transmitted out of all the messages which may be transmitted.

The growth of internal metrics in channel decoding procedures is a known issue. In the case of channel codes relying on convolutional codes the problem may be faced with different approaches.

For instance, certain hardware-based decoding architectures may rely on fixed point implementation so the number of bits available for representing data may be limited.

Also, it was observed that the dynamic range of path metrics in, e.g., a Viterbi decoder may often tend to grow due to the fact that these metrics are iteratively obtained through sum operations. However, the difference among metrics, e.g., their distance, remains bounded in a range $[-D/2, D/2]$.

This property may be exploited as disclosed, e.g., in A. P. Hekstra, "An alternative to metric rescaling in Viterbi decoders," IEEE Transactions on Communications, vol. 37, no. 11, pp. 1220-1222, November 1989. There, wrapping of metrics (specifically the path metrics) for Viterbi decoding of convolutional codes is proposed: the underlying idea is to avoid metric normalization by limiting the metric representation to the range $[-D/2, D/2-1]$ and looking at this range as circular.

This approach is based on the recognition that the Viterbi Algorithm (VA) has the property that its behavior is unaffected if a modulo operator is properly applied to the metrics; the modulo operation corresponds to the wrapping mechanism in two's complement arithmetic when an overflow occurs. From the arithmetic point of view, wrapping thus means that, when adding two or more data, overflow can occur, but it does not require to be handled.

For instance, for a generic metric $\beta$, $[\beta]_D = \beta \in$ for $[-D/2, D/2-1]$, $[\beta]_D = \beta - D$ for $\beta > D/2 - 1$ and $[\beta]_D = \beta + D$ for $\beta < -D/2$ where the operator $[\cdot]_D$ denotes the wrapping operation. When working with a fixed point 2's complement implementation, where D is a power of two, wrapping is automatic. In such an arrangement, metrics may only evolve circularly: if, for instance, D=32, this means that while, e.g., $1+3=4$ and $7+12=19$ without wrapping, with wrapping on still it is $1+3=4$, but $7+12=-13$.

In the following text, some numerical examples are given for the case D=32, that is for metrics represented by 5 (five) bits, by focusing on the order relationship $\geq$. Two metrics, e.g., $\beta_1$ and $\beta_2$ are exemplified, with $|\beta_1 - \beta_2| < D/2$. In the following, the subscript "wrap" is used to distinguish the case where wrapping is allowed from the case where wrapping is avoided.

Case 1

(one family of metrics): no metric has wrapped $\beta_1 = 15 \rightarrow \beta_{1,wrap} = 15$ $\beta_2 = 2 \rightarrow \beta_{2,wrap} = 2$ $\beta_1 > \beta_2$ and $\beta_{1,wrap} > \beta_{2,wrap}$ Case 2

(one family of metrics): two metrics have wrapped $\beta_1 = 19 \rightarrow \beta_{1,wrap} = -13$ $\beta_2 = 16 \rightarrow \beta_{2,wrap} = -16$ $\beta_1 > \beta_2$ and $\beta_{1,wrap} > \beta_{2,wrap}$ Case 3

(one family of metrics): one metric has wrapped $\beta_1 = 19 \rightarrow \beta_{1,wrap} = -13$ $\beta_2 = 10 \rightarrow \beta_{2,wrap} = 10$ $\beta_1 \beta_2$ and apparently $\beta_{1,wrap} < \beta_{2,wrap}$. However, $\beta_{1,wrap}$ and $\beta_{2,wrap}$ are modulo D quantities so $[\beta_{1,wrap} - \beta_{2,wrap}]_D = [-13-10]_{32} = [-23]_{32} = 9 > 0$.

Hence $\beta_{1,wrap} > \beta_{2,wrap}$.

Wrapping thus preserves both distances and the order relationship $\geq$, and may be used to avoid normalization during the generation of metrics, e.g., in Viterbi decoding of a convolutional code.

In the case of Viterbi decoding just considered, only one family of metrics evolves ($\beta_j$, $j \in J$ where J is a finite set of indices).

In the case of certain procedures, plural families of metrics may be considered. For instance, in the case of Bahl, Cocke, Jelinek and Raviv (BCJR) decoding (as presented, e.g., in L. R. Bahl, J. Cocke, F. Jelinek, and J. Raviv, "Optimal decoding of linear codes for minimizing symbol error rate," IEEE Transactions on Information Theory, vol. 20, no. 3, pp. 284-287, March 1974), a higher number of metrics may be dealt with, in comparison to Viterbi decoding: present or branch metrics, past or forward metrics, future or backward metrics, a posteriori metrics and extrinsic metrics.

These metrics combine with each other and the wrapping technique proposed, e.g., in Hekstra (previously cited) may not be directly applied to the whole decoding process. Indeed, the wrapping technique may be applied to the computation of past ($\alpha$) and future ($\beta$) metrics, but, in order to combine them while preserving the order relationship, metric normalization may be required, thus adding implementation cost.

It may be noted that normalization has been considered unavoidable at some point of the chain, namely when past and future metrics have to be added together, and the sum of wrapped quantities destroys indeed the order relationships present in the $\alpha$ and $\beta$ sets, respectively.

BRIEF SUMMARY

In what follows, some numeric examples are given for the case $$D_\alpha = D_\beta = D = 32.$$

Case 1
(two families of metrics): no metric has wrapped $$\left.\begin{array}{l}\alpha_k = 15 \to \alpha_{k,wrap} = 15 \\ \beta_j = 12 \to \beta_{j,wrap} = 12\end{array}\right\}\alpha_k + \beta_j = 27, \quad \alpha_{k,wrap} + \beta_{j,wrap} = 27$$

$$\left.\begin{array}{l}\alpha_h = 10 \to \alpha_{h,wrap} = 10 \\ \beta_i = 5 \to \beta_{i,wrap} = 5\end{array}\right\}\alpha_h + \beta_i = 15, \quad \alpha_{h,wrap} + \beta_{i,wrap} = 15,$$

Case 2
(two families of metrics): one metric has wrapped $$\left.\begin{array}{l}\alpha_k = 15 \to \alpha_{k,wrap} = 15 \\ \beta_j = 19 \to \beta_{j,wrap} = -13\end{array}\right\}\alpha_k + \beta_j = 34, \quad \alpha_{k,wrap} + \beta_{j,wrap} = 2$$

$$\left.\begin{array}{l}\alpha_h = 10 \to \alpha_{h,wrap} = 10 \\ \beta_i = 5 \to \beta_{i,wrap} = 5\end{array}\right\}\alpha_h + \beta_i = 15, \quad \alpha_{h,wrap} + \beta_{i,wrap} = 15,$$

Exemplary Case 1 refers to a situation where wrapping may not cause any problem.

It may be otherwise observed that in exemplary Case 2, $\alpha_k \beta_j = 34 > 14 = \alpha_h + \alpha_i$, but $\alpha_{k,wrap} + \beta_{j,wrap} = 2 < 15 = \alpha_{h,wrap} + \beta_{i,wrap}$. The order relationship in the unwrapped case is lost when operating with wrapped quantities, making it difficult to identify if a single metric has wrapped or not before combining it with another metric.

Similarly, it may be noted that normalization allows metrics to exit from the wrapped state. In other words, by normalization it may be possible to compute sums of metrics, compare two different sums and decide which sum is the greater one at the cost of: i) the logic circuits to compute the maximum (or minimum), ii) the logic circuits to normalize.

For instance, for the exemplary Case 2 above (two families of metrics, where one metric has wrapped) this problem may be addressed by resorting to a normalization technique, e.g., as follows:

Step 1: compute $\alpha_{max,wrap}$ $$[\alpha_{k,wrap} - \alpha_{h,wrap}]_D = [15-10]_{32} = 5 > 0 \to \alpha_{max,wrap} = 15$$

Step 2: compute $\beta_{max,wrap}$ $$[\beta_{j,wrap} - \beta_{i,wrap}]_D = [-13-5]_{32} = 14 > 0 \to \beta_{max,wrap} = -13$$

Step 3: compute $\alpha_{k,wrap,norm}$ and $\alpha_{h,wrap,norm}$ $$\alpha_{k,wrap,norm} = [\alpha_{k,wrap} - \alpha_{max,wrap}]_D = 15-15_{32} = 0$$

$$\alpha_{h,wrap,norm} = [\alpha_{h,wrap} - \alpha_{max,wrap}]_D = [10-15]_{32} = -5$$

Step 4: compute $\beta_{j,wrap,norm}$ and $\beta_{i,wrap,norm}$ $$\beta_{j,wrap,norm} = [\beta_{j,wrap} - \beta_{max,wrap}]_D = [-13-(-13)]_{32} = 0$$

$$\beta_{i,wrap,norm} = [\beta_{i,wrap} - \beta_{max,wrap}]_D = [5-(-13)]_{32} = -14$$

Step 5: combine the normalized metrics $$\left.\begin{array}{l}\alpha_k = 15 \to \alpha_{k,wrap,norm} = 0 \\ \beta_j = 19 \to \beta_{j,wrap,norm} = 0\end{array}\right\}\alpha_k + \beta_j = 34, \quad \alpha_{k,wrap,norm} + \beta_{j,wrap,norm} = 0$$

$$\left.\begin{array}{l}\alpha_h = 10 \to \alpha_{h,wrap,norm} = -5 \\ \beta_i = 5 \to \beta_{i,wrap,norm} = -14\end{array}\right\}\alpha_h + \beta_i = 15, \quad \alpha_{h,wrap,norm} + \beta_{i,wrap,norm} = -19,$$

After normalization $$\alpha_{k,wrap,norm} + \beta_{j,wrap,norm} = 0 > -19 = \alpha_{h,wrap,norm} + \beta_{i,wrap,norm}$$

While in the exemplary case considered the maximum is computed only for two quantities for simplicity of numeric illustration, this may in fact occur for a higher number of quantities, depending on the encoder states. In similar cases, complexity may rapidly grow because both the number of maximum operations and the number of normalization operations grow.

Document EP 1 317 071 B1 discloses a calculation block comprising a plurality of alpha metric inputs, each alpha metric input having a predetermined number of bits. An alpha circle boundary detector receives the plurality of alpha metric inputs and generates an alpha circle boundary cross signal indicating whether the two's complement format of any alpha metric input is either a two's complement positive number or a two's complement negative number in a most negative quadrant or not. A plurality of alpha metrics precision extend block are provided, with each alpha metrics precision extend block receiving the alpha circle boundary cross signal and the most significant bit of a corresponding alpha metric input and generating a two bit precision extension for the corresponding alpha metric input dependent upon the alpha circle boundary cross signal and the most significant bit of the alpha metrics input. A plurality of beta metric inputs are provided, each beta metric input having the predetermined number of bits. A beta circle boundary detector receives the plurality of beta metric inputs and generates a beta circle boundary cross signal indicating whether the two's complement format of any beta metric input is either a two's complement positive number or a two's complement negative number in a most negative quadrant or not. A plurality of beta metrics precision extend blocks are further provided, each beta metrics precision extend block receiving the beta circle boundary cross signal and the most significant bit of a corresponding beta metric input and generating a two bit precision extension for the corresponding beta metric input dependent upon the beta circle boundary cross signal and the most significant bit of the beta metrics input. An extrinsics block receives the alpha metrics inputs as precision extended by the corresponding alpha precision extend block and the beta metrics inputs as precision extended by the corresponding beta precision extend block. The extrinsics block includes an adder constructed to operate on two's complement numbers having two more bits than the predetermined number of bits.

In order to avoid normalization of past and future metrics, the arrangement of EP 1 317 071 B1 proceeds by:
1) checking if past metrics have been uniformly wrapped by:
   i) checking if there exists some positive past metric
   ii) checking if there exists some "big negative" past metric, e.g., a past metric in the bottom left quadrant [−D/2,−D/4[ of the wrapping circle
2) repeating point 1) for future metrics
3) extending past metrics and future metrics by two bits depending on points 1) and 2) before summing them, the way to extend depends on the output of point 1)
4) summing the extended metrics.

One may observe that in point 3) the arrangement of EP 1 317 071 B1 returns to the unwrapped case, which may require dynamic ranges to be extended by two bits: this may be annoying if other operations have to be performed after step 4, as may be the case in e.g. double binary turbo decoders, where summing the extended metrics (including the present metric in the sum) is performed for the metrics associated with each couple of bits considered and then a further subtraction operation is performed in order to derive the so-called extrinsic information (in terms of log-likelihood ratio).

In an embodiment, a method of processing digital data signals including producing for the digital data signals a plurality of families of metrics by allowing at least one metric of said plurality of families of metrics to wrap through a respective independent wrapping operation, includes: computing differences of metrics selected out of said plurality of families of metrics by avoiding combining metrics obtained through independent wrapping operations; and generating signals representative of order relationships of combinations of corresponding unwrapped metrics as a function of said differences. In an embodiment, with $\alpha^I, \alpha^{II}, \ldots, \alpha^N$ being said families of metrics, $\alpha^1 = \{\alpha^I_{k_I}, k_I \in K_I\}$, $\alpha^{II} = \{\alpha^{II}_{k_{II}}, k_{II} \in K_{II}\}, \ldots, \alpha^N = \{\alpha^N_{k_N}, k_N \in K_N\}$ and $K_I, K_{II}, \ldots, K_N$ a set of indices with $|\alpha^n_{k_n} - \alpha^n_{h_n}| < D_{\alpha_n}/2 \forall k_n, h_n \in K_n, \forall n = I, II, \ldots, N$, the method includes: allowing at least one metric in said families of metrics $\alpha^I, \alpha^{II}, \ldots, \alpha^N$ to wrap in a respective wrapping interval, and checking as a function of differences including wrapped metrics $$\sum_{n=1}^{N} [\alpha^n_{k_n,wrap} - \alpha^n_{h_n,wrap}]_{D_{\alpha_n}} > 0$$

if an order relationship $$\sum_{n=1}^{N} \alpha^n_{k_n} > \sum_{n=1}^{N} \alpha^n_{h_n}$$

exists between corresponding unwrapped metrics. In an embodiment, said digital data signals are arranged in data blocks, each data block including a sequence of bit signals, the data block being encoded with a convolutional code, the method including: producing for the data block a plurality of families of metrics, by allowing at least one metric of said plurality of families of metrics to wrap through a respective independent wrapping operation; executing on said data block metrics operations on said metrics of said plurality of families of metrics, wherein said metrics operations include computing differences of metrics selected out of said plurality of families of metrics by avoiding combining metrics obtained through independent wrapping operations; computing extrinsic information as a function of said differences of said metrics, and exploiting said extrinsic information in decoding said encoded data block. In an embodiment, said digital data signals are arranged in data blocks, each data block including a sequence of bit signals, the data block being encoded with a turbo code. In an embodiment, computing extrinsic information as a function of said differences of said metrics includes selecting dot triplets as a function of said differences of said metrics and computing extrinsic information from said dot triplets. In an embodiment, computing extrinsic information as a function of said differences of said metrics includes combining a set of extrinsic log-likelihood constituents. In an embodiment, the method includes producing metrics selected out of: present or branch metrics, past or forward metrics, future or backward metrics, a posteriori metrics and extrinsic metrics.

In an embodiment, a system for processing a plurality of families of metrics of digital data signals by allowing at least one metric of said plurality of families of metrics to wrap through a respective independent wrapping operation, includes: selectors configured to select metrics out of said plurality of families of metrics, and a computation module configured to generate signals representative of order relationships of combinations of corresponding unwrapped metrics as a function of said selected metrics, wherein said selectors and said computation module are configured to implement an embodiment of a method disclosed herein. In an embodiment, the system includes a digital signal interface configured to generate digital data signals. In an embodiment, a computer program product loadable into the memory of at least one computer includes software code portions for implementing the steps of one or more embodiments of methods disclosed herein.

One or more embodiments may refer to a corresponding system, to corresponding apparatus including a digital signal interface in combination with such a system as well as to a computer program product that can be loaded into the memory of at least one computer and comprises parts of software code that are able to execute the steps of a method when the product is run on at least one computer. As used herein, reference to such a computer program product is understood as being equivalent to reference to a computer-readable media containing instructions for controlling the processing system in order to co-ordinate implementation of a method according to embodiments. Reference to "at least one computer" is evidently intended to highlight the possibility of the present embodiments being implemented in modular and/or distributed form.

One or more embodiments may perform metrics operations without losing the order relationship and without performing normalization.

One or more embodiments may be applied in digital systems such as, e.g., communication systems involving channel decoding procedures like for instance the BCJR procedure.

One or more embodiments may order combination of metrics pertaining to different families of metrics allowed to wrap.

One or more embodiments may apply to decoding convolutional codes such as, e.g., decoding turbo codes (where for instance two parallel BCJR procedures are used).

One or more embodiments may provide a totally wrapped decoder for, e.g., BCJR convolutional decoding (e.g., Maximum-A-Posteriori or MAP decoding).

In one or more embodiments, such a totally wrapped decoder may dispense with any normalization of metrics during the decoding processing.

In one or more embodiments, all the, e.g., BCJR metrics may be wrapped and remain in a wrapped state even when they combine with one another. In one or more embodiments, this may involve a particular way of performing the operations of addition, subtraction and maximum, so that no normalization is employed.

One or more embodiments may provide a decoder which can reduce the cost, size, and energy consumption of a transmission system and equipment, by simplifying the processing of internal metrics.

In one or more embodiments this simplification may not adversely affect the error correcting performance of the decoder.

One or more embodiments may be based on digital computations involving more than one family of metrics, with at least one family allowed to wrap, while allowing ordering combinations of metrics belonging to different families by operating only on the corresponding wrapped metrics.

One or more embodiments may provide a totally wrapped MAP decoder architecture, where state metric wrapping may be employed to reduce the complexity and the critical path in the computation of state metrics.

One or more embodiments may avoid normalization when wrapped state metrics are combined together, e.g., to compute a-posteriori information.

One or more embodiments may avoid normalization leading to architectural simplification, thus reducing the cost, size, and power consumption of, e.g., communication system and equipment.

One or more embodiments may avoid normalization leading to reduced processing latency and/or higher throughput of, e.g., communication system and equipment.

One or more embodiments may involve one or more of the following features:
  receiving and storing a data block associated with a transmission time interval, the data block comprising a sequence of bits, the data block being encoded according to a convolutional code such as, e.g., a turbo code;
  deriving (e.g., obtaining) for the data block corresponding branch metrics;
  executing on the data block alpha and beta operations, e.g., for each decoding iteration, to update alpha and beta metrics;
  allowing independent wrapping of alpha and beta metrics during update operations;
  computing separately wrapped differences among alpha and beta metrics, without combining metrics derived through independent wrapping operations ("hat" and "tilde" computation);
  selecting dot triplets;
  computing extrinsic information;

One or more embodiments may provide a system including:
  a set of adders and multiplexers to compute hat and tilde metrics
  a set of adders, comparators and multiplexers to derive dot metrics
  a set of adders to obtain extrinsic information.

In an embodiment, a method comprises: producing from digital data signals a plurality of families of metrics, at least one family of the plurality of families allowing metric wrapping; computing a set of differences of metrics selected out of said plurality of families of metrics, the set of differences excluding differences between wrapping metrics of different families of the plurality of families of metrics; and generating signals representative of order relationships of combinations of corresponding unwrapped metrics based on said set of differences. In an embodiment, with $\alpha^I, \alpha^{II}, \ldots, \alpha^N$ being said families of metrics, $\alpha^I = \{\alpha^I_{k_I}, k_I \in K_I\}$, $\alpha^{II} = \{\alpha^{II}_{k_{II}}, k_{II} \in K_{II}\}, \ldots, \alpha^N = \{\alpha^N_{k_N}, k_N \in K_N\}$, $K_I, K_{II}, \ldots, K_N$ a set of indices with $|\alpha^n_{k_n} - \alpha^n_{h_n}| < D_{\alpha_n}/2 \forall k_n, h_n \in K_n, \forall n=I, II, \ldots N$, and $D_{\alpha_n}$ a family wrapping modulo, the method comprises: allowing at least one metric in said families of metrics $\alpha^I, \alpha^{II}, \ldots, \alpha^N$ to wrap in a respective family wrapping interval, and checking as a function of differences including wrapped metrics $$\sum_{n=I}^{N} [\alpha^n_{k_n, wrap} - \alpha^n_{h_n, wrap}]_{D_{\alpha_n}} > 0$$

if an order relationship $$\sum_{n=I}^{N} \alpha^n_{k_n} > \sum_{n=I}^{N} \alpha^n_{h_n}$$

exists between corresponding unwrapped metrics. In an embodiment, said digital data signals are arranged in data blocks, each data block including a sequence of bit signals and being encoded with a convolutional code, the method comprising, for a data block: producing for the data block a plurality of families of metrics, at least one family of the plurality of families allowing metric wrapping; computing for the block a set of differences of metrics selected out of said plurality of families of metrics, the set of differences of metrics for the block excluding differences between wrapping metrics of different families of the plurality of families of metrics for the block; computing extrinsic information for the block as a function of said set of differences of said metrics for the block; and decoding the block based on said extrinsic information for the block. In an embodiment, said data blocks are encoded with a turbo code. In an embodiment, computing extrinsic information for the block includes selecting dot triplets as a function of said set of differences of said metrics for the block and computing extrinsic information from said dot triplets. In an embodiment, computing extrinsic information for the block includes combining a set of extrinsic log-likelihood constituents. In an embodiment, the metrics are selected out of: present metrics; branch metrics; past metrics; forward metrics; future metrics; backward metrics; a posteriori metrics; and extrinsic metrics.

In an embodiment, a device, comprises: an input configured to receive digital data signals; digital signal processing circuitry configured to: produce from digital data signals a plurality of families of metrics, at least one family of the plurality of families allowing metric wrapping; compute a set of differences of metrics selected out of said plurality of families of metrics, the set of differences excluding differences between wrapping metrics of different families of the plurality of families of metrics; and generate signals representative of order relationships of combinations of corresponding unwrapped metrics based on said set of differences. In an embodiment, with $\alpha^I, \alpha^{II}, \ldots, \alpha^N$ being said families of metrics, $\alpha^I = \{\alpha^I_{k_I}, k_I \in K_I\}$, $\alpha^{II} = \{\alpha^{II}_{k_{II}}, k_{II} \in K_{II}\}, \ldots, \alpha^N = \{\alpha^N_{k_N}, k_N \in K_N\}$, $K_I, K_{II}, \ldots, K_N$ a set of indices with $|\alpha^n_{k_n} - \alpha^n_{h_n}| < D_{\alpha_n}/2 \forall k_n, h_n \in K_n, \forall n=I, II, \ldots N$, and $D_{\alpha_n}$ a family wrapping modulo, the digital signal processing circuitry is configured to: allow at least one metric in said families of metrics $\alpha^I, \alpha^{II}, \ldots, \alpha^N$ to wrap in a respective family wrapping interval, and check as a function of differences including wrapped metrics $$\sum_{n=1}^{N} [\alpha_{k_n,wrap}^n - \alpha_{h_n,wrap}^n]_{D_{\alpha_n}} > 0$$

if an order relationship $$\sum_{n=1}^{N} \alpha_{k_n}^n > \sum_{n=1}^{N} \alpha_{h_n}^n$$

exists between corresponding unwrapped metrics. In an embodiment, said digital data signals are arranged in data blocks, each data block including a sequence of bit signals and being encoded with a convolutional code, and the digital signal processing circuitry is configured to process a data block by: producing for the data block a plurality of families of metrics, at least one family of the plurality of families allowing metric wrapping; computing for the block a set of differences of metrics selected out of said plurality of families of metrics, the set of differences of metrics for the block excluding differences between wrapping metrics of different families of the plurality of families of metrics for the block; computing extrinsic information for the block as a function of said set of differences of said metrics for the block; and decoding the block based on said extrinsic information for the block. In an embodiment, said data blocks are encoded with a turbo code. In an embodiment, the digital signal processing circuitry is configured to select dot triplets as a function of said set of differences of said metrics for the block and compute extrinsic information from said dot triplets. In an embodiment, the digital signal processing circuitry is configured to combine a set of extrinsic log-likelihood constituents. In an embodiment, the digital signal processing circuitry comprises: a plurality of selectors configured to select metrics out of said plurality of families of metrics; and computation circuitry configured to generate extrinsic information based on the metrics selected by the plurality of selectors.

In an embodiment, a system comprises: a plurality of selectors configured to: select metrics out of a plurality of families of metrics produced from digital data signals, at least one family of the plurality of families of metrics allowing metric wrapping; and compute a set of differences of metrics selected out of said plurality of families of metrics, the set of differences excluding differences between wrapping metrics of different families of the plurality of families of metrics; and circuitry configured to generate signals representative of order relationships of combinations of corresponding unwrapped metrics based on said set of differences. In an embodiment, the system comprises decoding circuitry configured to decode digital data signals based on the generated signals representative of order relationships. In an embodiment, with $\alpha^I, \alpha^{II}, \ldots, \alpha^N$ being said families of metrics, $\alpha^I = \{\alpha^I_{k_I}, k_I \in K_I\}$, $\alpha^{II} = \{\alpha^{II}_{k_{II}}, k_{II} \in K_{II}\}$, $\ldots$, $\alpha^N = \{\alpha^N_{k_N}, k_N \in K_N\}$, $K_I, K_{II}, \ldots, K_N$ a set of indices with $|\alpha^n_{k_n} - \alpha^n_{h_n}| < D_{\alpha_n}/2 \; \forall \; k_n, h_n \in K_n, \forall \; n=I, II, \ldots N, D_{\alpha_n}$ a family wrapping modulo, and at least one metric in said families of metrics $\alpha^I, \alpha^{II}, \ldots, \alpha^N$ a allowed to wrap in a respective family wrapping interval, the circuitry configured to generate signals representative of order relationships is configured to: check as a function of differences including wrapped metrics $$\sum_{n=1}^{N} [\alpha_{k_n,wrap}^n - \alpha_{h_n,wrap}^n]_{D_{\alpha_n}} > 0$$

if an order relationship $$\sum_{n=1}^{N} \alpha_{k_n}^n > \sum_{n=1}^{N} \alpha_{h_n}^n$$

exists between corresponding unwrapped metrics. In an embodiment, the plurality of selectors are configured to process metrics produced from blocks of data encoded with a convolutional code.

In an embodiment, a non-transitory computer-readable medium's contents configure a digital signal decoder to perform a method, the method comprising: producing from digital data signals a plurality of families of metrics, at least one family of the plurality of families of metrics allowing metric wrapping; computing for the block a set of differences of metrics selected out of said plurality of families of metrics, the set of differences excluding differences between wrapping metrics of different families of the plurality of families of metrics; and generating signals representative of order relationships of combinations of corresponding unwrapped metrics based on said set of differences. In an embodiment, with $\alpha^I, \alpha^{II}, \ldots, \alpha^N$ being said families of metrics, $\alpha^I = \{\alpha^I_{k_I}, k_I \in K_I\}$, $\alpha^{II} = \{\alpha^{II}_{k_{II}}, k_{II} \in K_{II}\}$, $\ldots$, $\alpha^N = \{\alpha^N_{k_N}, k_N \in K_N\}$, $K_I, K_{II}, \ldots, K_N$ set of indices with $|\alpha^n_{k_n} - \alpha^n_{h_n}| < D_{\alpha_n}/2 \; \forall \; k_n, h_n \in K_n, \forall \; n=I, II, \ldots,$ and $D_{\alpha_n}$ a family wrapping modulo, the method comprises: allowing at least one metric in said families of metrics $\alpha^I, \alpha^{II}, \ldots, \alpha^N$ to wrap in a respective family wrapping interval, and checking as a function of differences including wrapped metrics $$\sum_{n=1}^{N} [\alpha_{k_n,wrap}^n - \alpha_{h_n,wrap}^n]_{D_{\alpha_n}} > 0$$

if an order relationship $$\sum_{n=1}^{N} \alpha_{k_n}^n > \sum_{n=1}^{N} \alpha_{h_n}^n$$

exists between corresponding unwrapped metrics. In an embodiment, said digital data signals are arranged in data blocks, each data block including a sequence of bit signals and being encoded with a convolutional code, the method comprising, for a data block: producing for the data block a plurality of families of metrics, at least one family of the plurality of families allowing metric wrapping; computing for the block a set of differences of metrics selected out of said plurality of families of metrics, the set of differences of metrics for the block excluding differences between wrapping metrics of different families of the plurality of families of metrics for the block; computing extrinsic information for the block as a function of said set of differences of said metrics for the block; and decoding the block based on said extrinsic information for the block. In an embodiment, computing extrinsic information for the block includes selecting dot triplets as a function of said set of differences of said metrics for the block and computing extrinsic information from said dot triplets.

BRIEF DESCRIPTION OF THE SEVERAL VIEWS OF THE FIGURES

One or more embodiments will now be described, purely by way of non-limiting example, with reference to the annexed figures, wherein.

DETAILED DESCRIPTION

Figure 1:
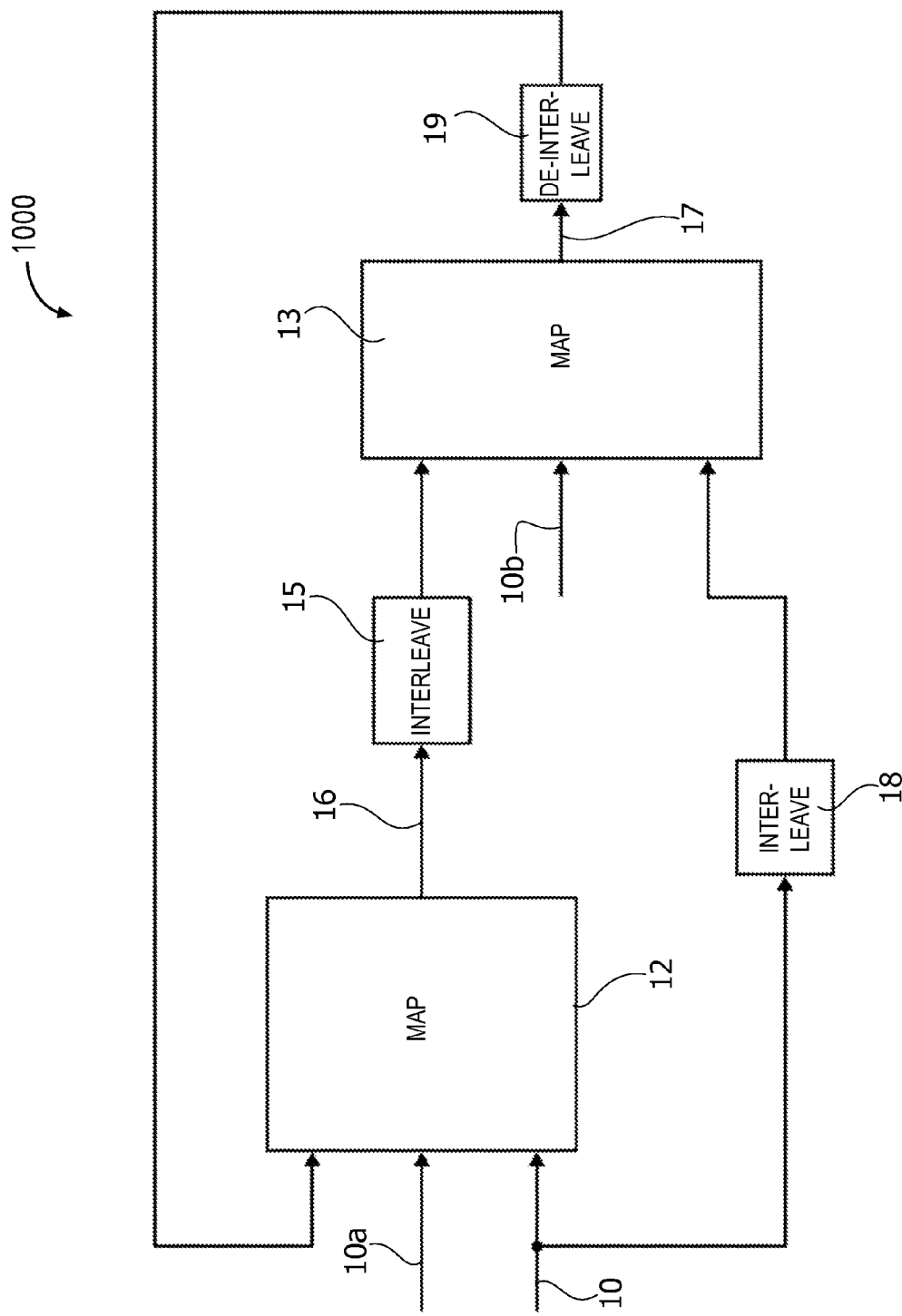
FIG. 1 is a functional block diagram of a digital data decoder.

In the ensuing description various specific details are illustrated, aimed at providing an in-depth understanding of various examples of embodiments. The embodiments may be obtained without one or more of the specific details, or with other methods, components, materials, etc. In other cases, known structures, materials, or operations are not illustrated or described in detail so that the various aspects of the embodiments will not be obscured.

Reference to "an embodiment" or "one embodiment" in the framework of the present description is intended to indicate that a particular configuration, structure, or characteristic described in relationship to the embodiment is comprised in at least one embodiment. Hence, phrases such as "in an embodiment" or "in one embodiment" that may be present in various points of the present description do not necessarily refer to one and the same embodiment. Moreover, particular conformations, structures, or characteristics may be combined in any adequate way in one or more embodiments.

Also, some or all of the modules/functions exemplified herein may be implemented in hardware, software, firmware, or a combination or subcombination of hardware, software, and firmware. For example, some or all of these module/functions may be implemented by means of a computing circuit, such as a microprocessor, microcontroller, multi-core platforms or GPU, that executes program instructions, or may be performed by a hardwired or firmware-configured circuit such as, e.g., an ASIC, an FPGA, or any other circuit/system described via VHDL and synthetized.

The references used herein are provided merely for the convenience of the reader and hence do not define the sphere of protection or the scope of the embodiments.

The instant detailed description refers, purely by way of example, to decoding of digital signals.

It will be otherwise appreciated that one or more embodiments may apply generally to digital e.g., computer implemented—computation involving more than one family of metrics, with at least one family allowed to wrap, while allowing ordering combinations of metrics belonging to different families by operating only on the corresponding wrapped metrics.

For instance, one or more embodiments may involve processing several families of metrics allowing to order sums of metrics by acting on corresponding wrapped metrics.

The instant detailed description thus presents non-limiting examples of how such an approach may be applied in MAP (e.g., BCJR) decoding, e.g., as a part of a decoding process of digital signals encoded by means of a convolutional code such as, e.g., a turbo code.

The instant detailed description is thus generally exemplary of processing digital data by:
  producing for the digital data a plurality of families of metrics, said producing being realized by allowing at least one metric of said plurality of families of metrics to wrap through a respective independent wrapping operation
  computing (wrapped) differences of said metrics of said plurality of families of metrics without combining metrics derived through independent wrapping operations;
  using said differences to infer order relations on combinations of corresponding unwrapped metrics.

FIG. 1 is an exemplary functional block diagram of a decoder for digital signals. Such a decoder may be used in many applications such as, e.g., fixed and mobile communications (both user equipment), computers (e.g., disk drives and SSD), entertainment apparatus (e.g., digital TV), memory devices (e.g., flash).

A purpose of such a decoder is reconstructing an original bit stream which has been encoded to counter possible corruption due to transmission through a noisy environment.

One or more embodiments may apply to decoding convolutional codes such as, e.g., so-called "turbo" codes, a class of parallel-concatenated convolutional codes that may approach the theoretical limits of Shannon's theorem with less decoding complexity than other longer convolutional codes. Concatenation with an outer algebraic code (e.g., Reed-Solomon) may address the issue of error floors inherent to turbo codes.

In one or more embodiments, reconstructing the original bit stream may involve tracing through multiple passes or iterations through the turbo trellis function.

The exemplary decoder of FIG. 1 may be assumed to operate, e.g., on a parallel-concatenated turbo encoded digital signal made up of an input parity stream signal 10 plus systematic stream signals 10$a$ and 10$b$. The turbo encoded signal may be produced, e.g., by a single binary encoder, for instance two rate ½ parallel recursive systematic convolutional encoders separate by a turbo interleaver or by a double binary encoder, for instance a two rate ⅔ 8-state recursive systematic convolutional encoder separated by a turbo interleaver as exemplified in the following description.

The exemplary decoder 1000 of FIG. 1 generates soft decisions from two MAP blocks 12 and 13 that produce extrinsic information 16 and 17, respectively. The exemplary decoder of FIG. 1 also includes two interleaver blocks 15, 18 plus a de-interleaver block 19.

The first MAP block 12 receives parity input data 10 and systematic input data 10$a$. In addition to systematic data 10$b$, the second MAP block 13 receives extrinsic information 16 from the first MAP block 12 interleaved by the interleaver block 15 plus the input stream 10 after interleaving by the interleaver block 18. The extrinsic information 17 output from the second MAP block 13 is de-interleaved in the block 19 and fed back as a further input to the first MAP block 12 in addition to the parity input data 10 and systematic input data 10$a$. Extrinsic information and systematic information are then used to generate the a-posteriori information based upon which the decoder decides which bits have been encoded.

The general layout and the basic underlying operating principles of a decoder as exemplified in FIG. 1 are otherwise conventional (see, e.g., C. Berrou, A. Glavieux and P. Thitimajshima, "Near Shannon limit error correcting coding and decoding: Turbo codes," IEEE International Conference on Communications, pp. 1064-1070, 1993), which makes it unnecessary to provide a more detailed description herein.

MAP blocks 12 and 13 include alpha, beta and gamma processor to produce alpha state metrics, beta state metrics and gamma branch metrics. Basic equations for the computation of these metrics can be found, e.g., in L. R. Bahl, J. Cocke, F. Jelinek, and J. Raviv, "Optimal decoding of linear codes for minimizing symbol error rate," IEEE Transactions on Information Theory, vol. 20, no. 3, pp. 284-287, March 1974) already cited.

In one or more embodiments, the variables for the MAP procedure may be represented by the natural logarithm of probabilities. This may allow for simplification of, e.g., very large scale integration (VLSI) implementation.

In one or more embodiments, alpha and beta metrics may be generated by a respective processor by allowing independent wrapping.

Figure 2:
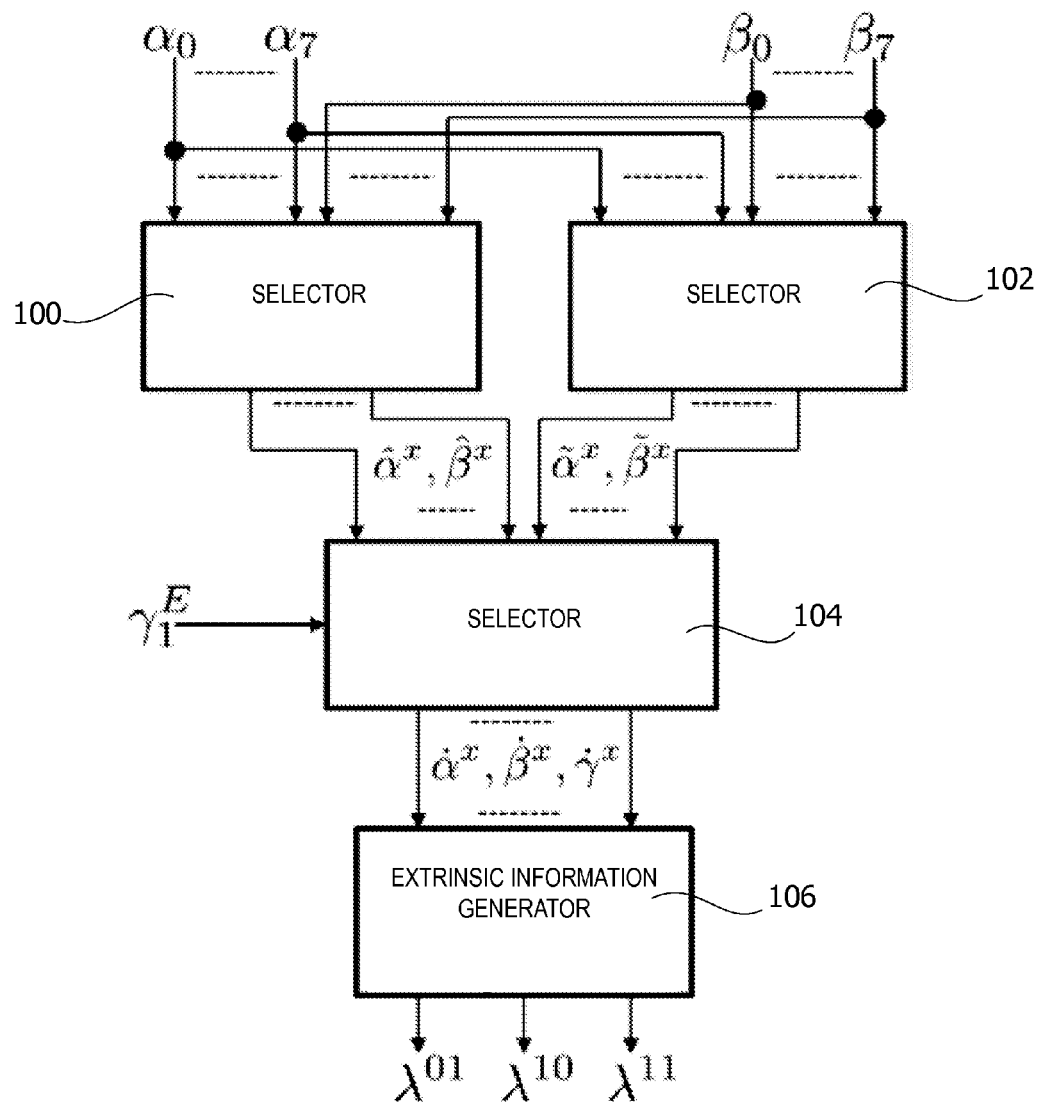
FIG. 2 is a high level block scheme exemplary of one or more embodiments.

FIG. 2 exemplifies extrinsic generation according to one or more embodiments.

In one or more embodiments, both alpha and beta state metrics may be used to generate the extrinsics.

In one or more embodiments, the variables for the MAP procedure are usually represented by the natural logarithm of probabilities. This may allow simplification of, e.g., very large scale integration (VLSI) implementation.

Also, it will be appreciated that the decoder schematically represented herein is exemplary of a wide class of devices based on the operating principles of one or more embodiments for decoding digital data by:
  receiving a data block associated with a time interval, the data block comprising a sequence of bits, the data block being encoded by means of, e.g., a convolutional code such as a turbo code,
  producing for the data block a plurality of families of metrics,
  executing on said data block metrics operations, e.g., for each decoding iteration, to update said metrics of said plurality of families of metrics,
  computing extrinsic information as a function of said metrics, and
  exploiting said extrinsic information in decoding said encoded data block.

In one or more embodiments, as better detailed in what follows, an arrangement as exemplified in FIG. 2 may be configured for:
  executing on data block metrics operations for each decoding iteration to update said metrics of said plurality of families of metrics by allowing at least one metrics of said plurality of families of metrics to wrap during update operations through a respective independent wrapping operation,
  computing differences of said metrics of said plurality of families of metrics without combining metrics derived through independent wrapping operations,
  computing extrinsic information as a function of said differences of said metrics, and
  exploiting said extrinsic information in decoding said encoded data block.

In one or more embodiments, an arrangement as exemplified in FIG. 2 may be configured to operate on alpha state metrics input data (e.g., $\alpha_0, \ldots, \alpha_7$) and beta state metrics input data (e.g., $\beta_0, \ldots, \beta_7$) in order to compute extrinsic output information (e.g., $\lambda^{01}, \lambda^{10}, \lambda^{11}$).

In one or more exemplary embodiments (as further detailed in what follows), an arrangement as exemplified in FIG. 2 may include:
  a first selection module/function 100 configured for the selection of points of maximum denoted as "hat" state metrics;
  a second selection module/function 102 configured for the selection of points of maximum denoted as "tilde" state metrics;
  a third selection module/function 104 operating on the hat and tilde state metrics, e.g., as a function of extrinsic branch metric information, e.g., $\gamma_1^E$;
  an extrinsic information computation module/function 106 configured to compute extrinsic output information $\lambda^{01}$, $\lambda^{10}$, $\lambda^{11}$ from the output of a third selection module/function 104.

The schematic representation of FIG. 2 may correspond to one or more embodiments as better detailed in what follows, e.g., a BCJR-based turbo decoder configured to produce 8 wrapped forward metrics $\alpha_k$, k=0, 1, ..., 7 and 8 wrapped backward metrics $\beta_j$, j=0, 1, ..., 7. Also a corresponding rate ⅔ convolutional encoder may lead to a simplified case, where only one extrinsic branch metric $\gamma_1^E$ (derived from the channel parity LLRs) may be sufficient for decoding.

As explained in the summary portion of the description, certain implementations may encounter difficulties in understanding if:

$$\alpha_k + \beta_j > \alpha_h + \beta_i$$

while observing only wrapped metrics and the relationship $$\alpha_{k,wrap} + \beta_{j,wrap} > \alpha_{h,wrap} + \beta_{i,wrap}$$

and thus in choosing between the couple (k,j) and the couple (h,i).

It was observed that this may happen because in combining two metrics the order relationship present before wrapping is lost.

Such a difficulty may be dispensed with by referring to the relationship $$[\alpha_{k,wrap} - \alpha_{h,wrap}]_{D_\alpha} > [\beta_{i,wrap} - \beta_{j,wrap}]_{D_\beta}$$

where the differences are again computed in a wrapped mode, while however different "wrapping worlds" (e.g., associated to different families of metrics) are kept separated. In other words, the differences do not include any differences between a metric belonging to the $\alpha$ family and a metric belonging to the $\beta$ family.

In that respect one may refer to the exemplary case discussed in the foregoing as case 2 (with $D_\alpha = D_\beta = D = 32$), e.g., Case 2
(two families of metrics): one metric has wrapped $$\left.\begin{array}{l}\alpha_k = 15 \to \alpha_{k,wrap} = 15\\ \beta_j = 19 \to \beta_{j,wrap} = -13\end{array}\right\}\alpha_k + \beta_j = 34, \quad \alpha_{k,wrap} + \beta_{j,wrap} = 2$$
$$\left.\begin{array}{l}\alpha_h = 10 \to \alpha_{h,wrap} = 10\\ \beta_i = 5 \to \beta_{i,wrap} = 5\end{array}\right\}\alpha_h + \beta_i = 15, \quad \alpha_{h,wrap} + \beta_{i,wrap} = 15,$$

In this case, the indices (k,j) originate a sum greater than the one obtained with the (h,i) indices.

In one or more embodiments, this may be discriminated by checking:

$$[\alpha_{k,wrap} - \alpha_{h,wrap}]_D = [15-10]_{32} = 5 > -14 = [5-(-13)]_{32} = [\beta_{j,wrap} - \beta_{i,wrap}]_D$$

A concept underlying one or more embodiments may thus be that of allowing sums of quantities that have independently wrapped to be compared without introducing normalizations or trying to understand if one of the quantities has wrapped.

Such a comparison may be thought of in terms of understanding an order relationship present in sums of unwrapped quantities by working on the corresponding wrapped quantities.

Such an underlying principle exemplified for two families of metrics can be generalized to N families.

For instance, let $\alpha$, $\beta$ and $\delta$ three families of metrics with $|=_k-\alpha_h|<D_\alpha/2 \ \forall \ k, h \in K$, $\oplus \beta_j-\beta_i|<D_\beta/2 \ \forall \ i, j \in J$, $|\delta_l-\delta_m|<D_\delta/2 \ \forall \ l, m \in L$ where K, J and L are sets of indices.

In one or more embodiments, one may assume that each metric family is allowed to wrap: with, e.g., the $\alpha$ metrics wrapping modulo $D_\alpha$ in the interval $[-D_\alpha/2, D_\alpha/2-1]$, the $\beta$ metrics wrapping modulo $D_\beta$ in the interval $[-D_\beta/2, D_\beta/2-1]$ and the $\delta$ metrics wrapping modulo $D_\delta$ in the interval $[-D_\delta/2, D_\delta/2-1]$.

If the subscript "wrap" is used to highlight the fact that metrics are allowed to wrap then, $\forall \ k, h \in K, \forall \ i, j \in J, \forall \ l, m \in L$ it is possible to discover if $$\alpha_k+\beta_j+\delta_l>\alpha_h+\beta_i+\delta_m$$

on the basis of wrapped quantities only, by directly checking, e.g., the following equation that uses only wrapped quantities $$[\alpha_{k,wrap}-\alpha_{h,wrap}]_{D_\alpha}+[\beta_{j,wrap}-\beta_{i,wrap}]_{D_\beta}+[\delta_{l,wrap}-\delta_{m,wrap}]_{D_\delta}>0$$

Note that the differences are computed between metrics belonging to the same family of metrics (e.g., there are no differences between a metric belonging to the $\alpha$ family and a metric belonging to the $\beta$ family, between a metric belonging to the $\alpha$ family and a metric belonging to the $\delta$ family, or between a metric belonging to the $\beta$ family and a metric belonging to the $\delta$ family). More generally, if $\alpha^I, \alpha^{II}, \ldots, \alpha^N$ are N families of metrics, $\alpha^I=\{\alpha^I_{k_I}, k_I \in K_I\}$, $\alpha^{II}=\{\alpha^{II}_{k_{II}}, k_{II} \in K_{II}\}, \ldots, \alpha^N=\{\alpha^N_{k_N}, k_N \in K_N\}$ with $K_I, K_{II}, \ldots, K_N$ being sets of indices and the assumption is made that $|\alpha^n_{k_n}-\alpha^n_{h_n}|<D_{\alpha_n}/2 \ \forall \ k_n, h_n \in K_n, \forall \ n=I, II, \ldots N$ one may allow each metric family wrapping: $\alpha^I$ metrics wrapping modulo $D_{\alpha_I}$ in the interval $[D_{\alpha_I}/2, D_{\alpha_I}/2-1]$, the $\alpha^{II}$ metrics wrapping modulo $D_{\alpha_{II}}$ in the interval $[-D_{\alpha_{II}}/2, D_{\alpha_{II}}/2-1], \ldots$, and the $\alpha^N$ metrics wrapping modulo $D_{\alpha_N}$ in the interval $[-D_{\alpha_N}/2, D_{\alpha_N}/2-1]$ by using the subscript "wrap" to highlight the fact that metrics are allowed wrapping. Then, for $\forall \ k_n, h_n \in K_n, \forall \ n=I, II, \ldots, N$, it is possible to discover if $$\sum_{n=I}^{N} \alpha^n_{k_n} > \sum_{n=I}^{N} \alpha^n_{h_n}$$

on the basis of wrapped quantities only, e.g., by directly checking the following equation that uses only wrapped quantities $$\sum_{n=I}^{N} [\alpha^n_{k_n,wrap} - \alpha^n_{h_n,wrap}]_{D_{\alpha_n}} > 0.$$

One or more embodiments may work even in mixed cases where not all the N families are allowed to wrap, but even at least one would wrap.

This may be explained by noting that, for metrics families not allowed to wrap, modulo differences end up by corresponding to standard differences.

The form of an interval where a metric family is allowed wrapping, e.g., $[-D_{\alpha/2}, D_{\alpha/2}-1]$, may be chosen because, if $D_\alpha$ is a power of two, it corresponds to the two's complement fixed point representation. However, this choice is only illustrative and it does not constitute a limitation of the embodiments: in fact a metric family could be allowed to wrap in a generic interval $[\alpha_{inf}, \alpha_{sup}]$ by choosing $D_\alpha=\alpha_{sup}-\alpha_{inf}+1$ and $|\alpha_k-\alpha_h|<\text{ceil}(D_\alpha/2) \ \forall \ k, h \in K$, where ceil(z) rounds z to the closest integer greater or equal to z.

One or more embodiments may operate recursively.

For instance, by assuming—for the sake of simplicity—that two families of metrics are present, e.g., $\alpha$ and $\beta$, one may note that a problem in the form:

$$\text{Max}\{\alpha_k+\beta_j, \alpha_h+\beta_i, \alpha_p+\beta_y\}$$

can be iteratively solved as $$\text{Max}\{\text{Max}\{\alpha_k+\beta_j, \alpha_h+\beta_i\}, \alpha_p+\beta_y\}$$

which, in turn, can be solved by working on wrapped quantities only by checking $$[\alpha_{k,wrap}-\alpha_{h,wrap}]_{D_\alpha}>[\beta_{i,wrap}-\beta_{j,wrap}]_{D_\beta}$$

and performing a similar checking using the couple $(\alpha_{p,wrap}, \beta_{y,wrap})$ in the place of the one between the couples $(\alpha_{k,wrap}, \beta_{j,wrap})$ and $(\alpha_{h,wrap}, \beta_{i,wrap})$.

In the following text, one or more embodiments will be exemplified by referring to the exemplary case of BCJR decoding of a turbo code.

For the sake of simplicity, the subscript "wrap" for wrapped metrics will be omitted in the following description.

In one or more embodiments, the metrics for BCJR decoding may be modified, e.g., by performing forward recursion by computing wrapped sums of past state metrics ($\alpha_k$) with present metrics ($\gamma_1$) and then taking the wrapped maximum of the wrapped sums.

In one or more embodiments, future metric recursion may similarly rely on the calculation of wrapped sums of the backward metrics ($\beta_j$) with present metrics, by taking the wrapped maximum of the wrapped sums. Extrinsic metrics may be obtained by first generating extrinsic log-likelihood constituents $\alpha^{\blacksquare x}, \beta^{\blacksquare x}, \gamma^{\blacksquare x}$ and then combining them together as explained in what follows.

One or more embodiments may operate in the same way for the a-posteriori metric generation by replacing the extrinsic part of branch metrics with the full branch metric.

One or more embodiments may provide a "totally wrapped" decoder, as in the case of, e.g., a double binary turbo encoder with two rate 2/3 8-state recursive systematic convolutional encoders separated by a turbo interleaver as adopted, e.g., in the HomePlug AV standard.

In one or more embodiments, a BCJR-based HomePlug AV turbo decoder may produce 8 wrapped forward metrics $\alpha_k$, k=0, 1, . . . , 7 and 8 wrapped backward metrics $\beta_j$, j= 0, 1, . . . , 7. Moreover, the rate 2/3 convolutional encoders in HomePlug AV lead to a simplified case, where only one extrinsic branch metric $\gamma_1^E$ (derived from the channel parity LLRs) is sufficient for decoding.

For the sake of ease of presentation, one or more embodiments (e.g., the computation of the extrinsic log-likelihood constituents) will be detailed in the following case of a HomePlug AV turbo decoder.

As indicated, the schematic block diagram of FIG. 2 provides a high level representation of blocks possibly involved in generating the extrinsic information $\lambda^u$, e.g.:

a first selection module/function 100 configured for the selection of points of maximum denoted as "hat" state metrics;

a second selection module/function 102 configured for the selection of points of maximum denoted as "tilde" state metrics;

a third selection module/function 104 operating on the hat and tilde state metrics, e.g., as a function of extrinsic branch metric information, e.g., $\gamma_1^E$;

an extrinsic information computation module/function 106 configured to compute extrinsic output information $\lambda^{01}$, $\lambda^{10}$, $\lambda^{11}$ from the output of the third selection module/function 104.

In one or more embodiments, producing the extrinsic information items and grouping them on the basis of uncoded couple values u=00, u=01, u=10, u=11 may involve computing:

$$\lambda^u = \max\{S^u\} = \max\{S^{00}\}$$

where $S^u$ and $S^{00}$ are the sets of the sums of the possible triplets $(\alpha, \beta, \gamma)$ for each possible u, namely $$S^{00} = \begin{cases} \begin{rcases} \alpha_0 + \beta_0 \\ \alpha_2 + \beta_1 \\ \alpha_4 + \beta_2 \\ \alpha_6 + \beta_3 \end{rcases} (\hat{\alpha}^{00}, \hat{\beta}^{00}, \hat{\gamma}^{00} = 0) \\ \begin{rcases} \alpha_1 + \beta_5 + \gamma_1^E \\ \alpha_3 + \beta_4 + \gamma_1^E \\ \alpha_5 + \beta_7 + \gamma_1^E \\ \alpha_7 + \beta_6 + \gamma_1^E \end{rcases} (\tilde{\alpha}^{00}, \tilde{\beta}^{00}, \tilde{\gamma}^{00} = \gamma_1^E) \end{cases},$$

$$S^{01} = \begin{cases} \begin{rcases} \alpha_0 + \beta_2 + \gamma_1^E \\ \alpha_2 + \beta_3 + \gamma_1^E \\ \alpha_4 + \beta_0 + \gamma_1^E \\ \alpha_6 + \beta_1 + \gamma_1^E \end{rcases} (\hat{\alpha}^{01}, \hat{\beta}^{01}, \hat{\gamma}^{01} = \gamma_1^E) \\ \begin{rcases} \alpha_1 + \beta_7 \\ \alpha_3 + \beta_6 \\ \alpha_5 + \beta_5 \\ \alpha_7 + \beta_4 \end{rcases} (\tilde{\alpha}^{01}, \tilde{\beta}^{01}, \tilde{\gamma}^{01} = 0) \end{cases},$$

$$S^{11} = \begin{cases} \begin{rcases} \alpha_0 + \beta_1 \\ \alpha_2 + \beta_0 \\ \alpha_4 + \beta_3 \\ \alpha_6 + \beta_2 \end{rcases} (\hat{\alpha}^{11}, \hat{\beta}^{11}, \hat{\gamma}^{11} = 0) \\ \begin{rcases} \alpha_1 + \beta_4 + \gamma_1^E \\ \alpha_3 + \beta_5 + \gamma_1^E \\ \alpha_5 + \beta_6 + \gamma_1^E \\ \alpha_7 + \beta_7 + \gamma_1^E \end{rcases} (\tilde{\alpha}^{11}, \tilde{\beta}^{11}, \tilde{\gamma}^{11} = \gamma_1^E) \end{cases},$$

$$S^{10} = \begin{cases} \begin{rcases} \alpha_0 + \beta_3 + \gamma_1^E \\ \alpha_2 + \beta_2 + \gamma_1^E \\ \alpha_4 + \beta_1 + \gamma_1^E \\ \alpha_6 + \beta_0 + \gamma_1^E \end{rcases} (\hat{\alpha}^{10}, \hat{\beta}^{10}, \hat{\gamma}^{10} = \gamma_1^E) \\ \begin{rcases} \alpha_1 + \beta_6 \\ \alpha_3 + \beta_7 \\ \alpha_5 + \beta_4 \\ \alpha_7 + \beta_5 \end{rcases} (\tilde{\alpha}^{10}, \tilde{\beta}^{10}, \tilde{\gamma}^{10} = 0) \end{cases}$$

For each value of u the maximum among the 8 sums of wrapped metrics shown above may be computed. In accordance with the principles discussed in the foregoing, none of the reported sums may be calculated to determine the maximum among them because otherwise the order relationship on corresponding unwrapped metrics would be destroyed since all the metrics are wrapped quantities.

It has been observed that for each value of u the corresponding equations can be grouped into two subsets, and such grouping may allow temporarily neglecting the extrinsic gamma metric: indeed inside a subset the presence of $\gamma_1^E$ may be irrelevant.

This fact is exemplified in FIG. 2 by the first selection steps 100, 102 concerning only the two families of metrics α and β, followed by the second selection step 104 including also the family of metrics γ. By having the superscripts hat (^) and tilde (˜) denote the (α, β) constituent couples (pairs) that correspond to the maximum value in the two subsets, respectively, each of the four hat and tilde (α, β) couples can be obtained with a building block and four selection signals as depicted in FIGS. 3 to 6.

Figure 3:
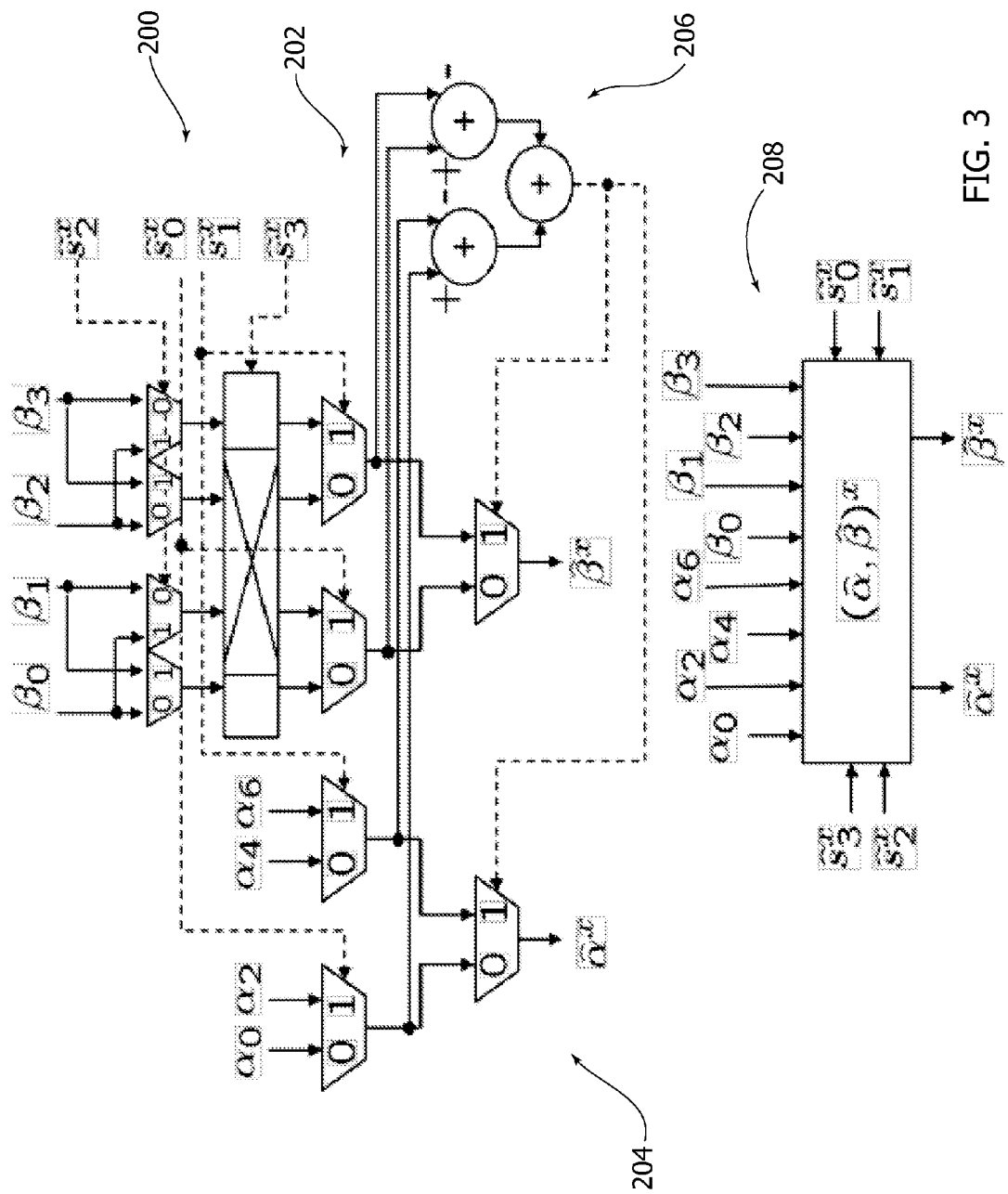
FIG. 3 is a block diagram showing an example of selection of maximum values denoted as "hat" state metrics.
Figure 4:
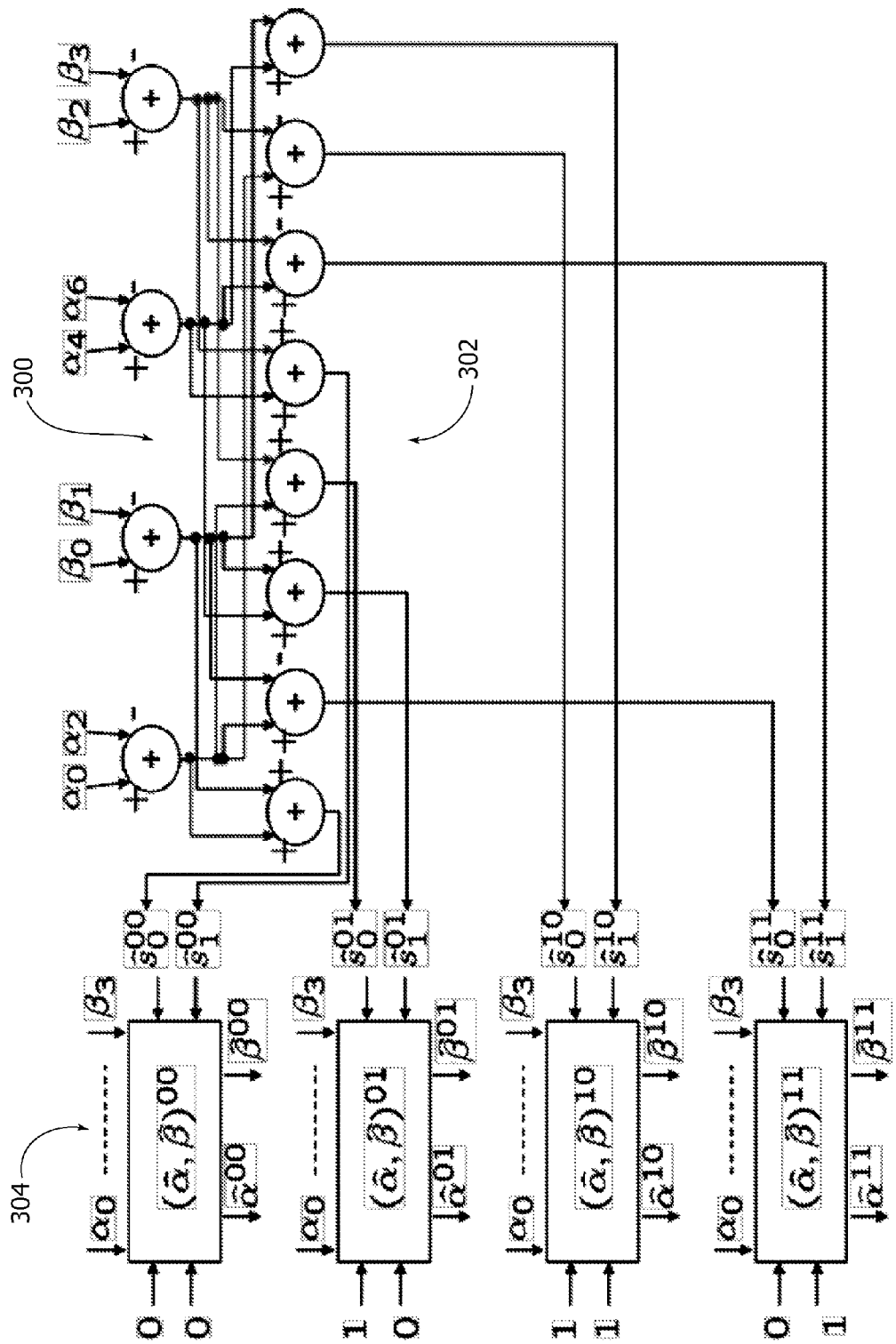
FIG. 4 is a block diagram showing possible details of hat selection signals.
Figure 5:
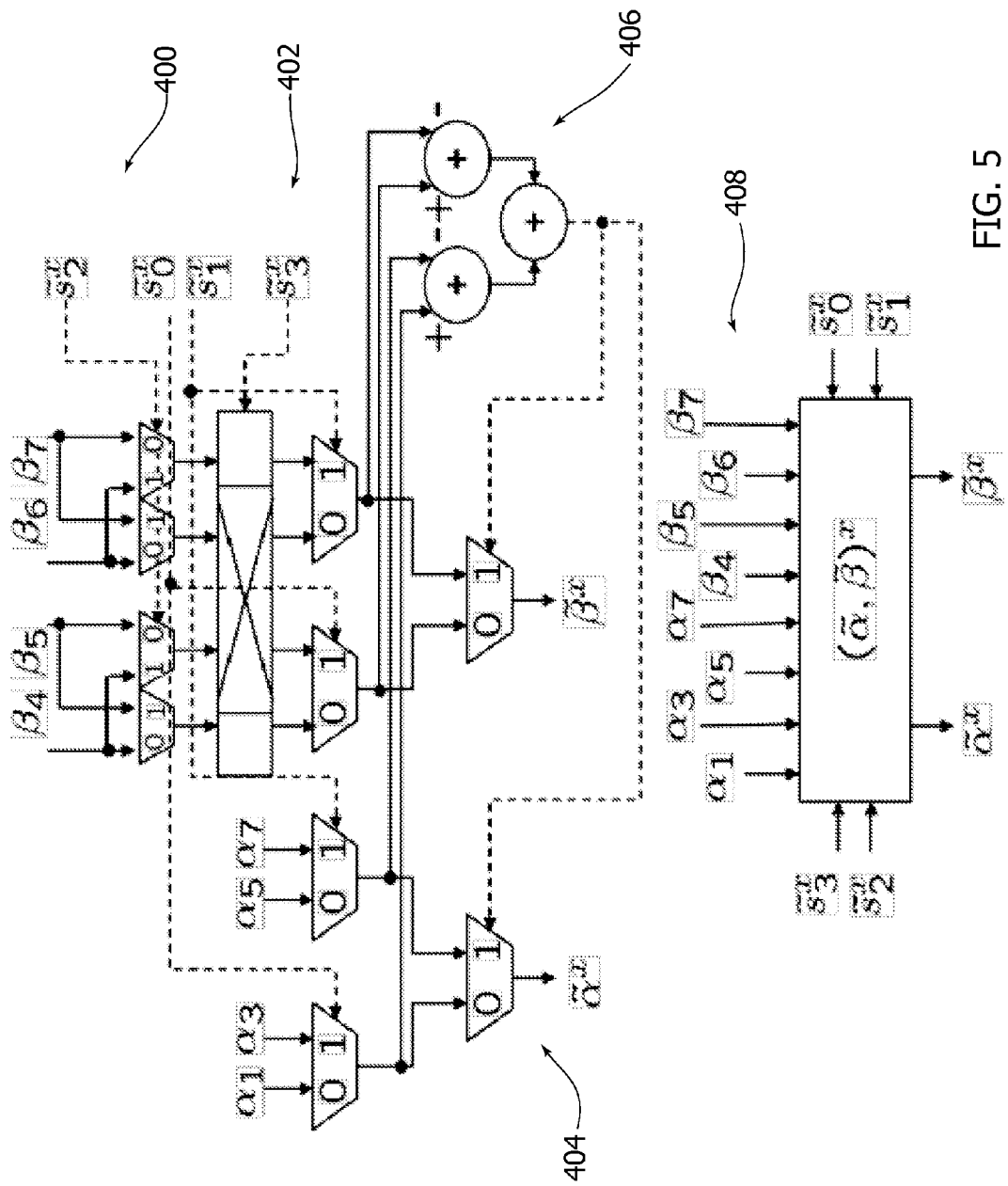
FIG. 5 is a block diagram showing an example of selection of maximum values denoted as "tilde" state metrics.
Figure 6:
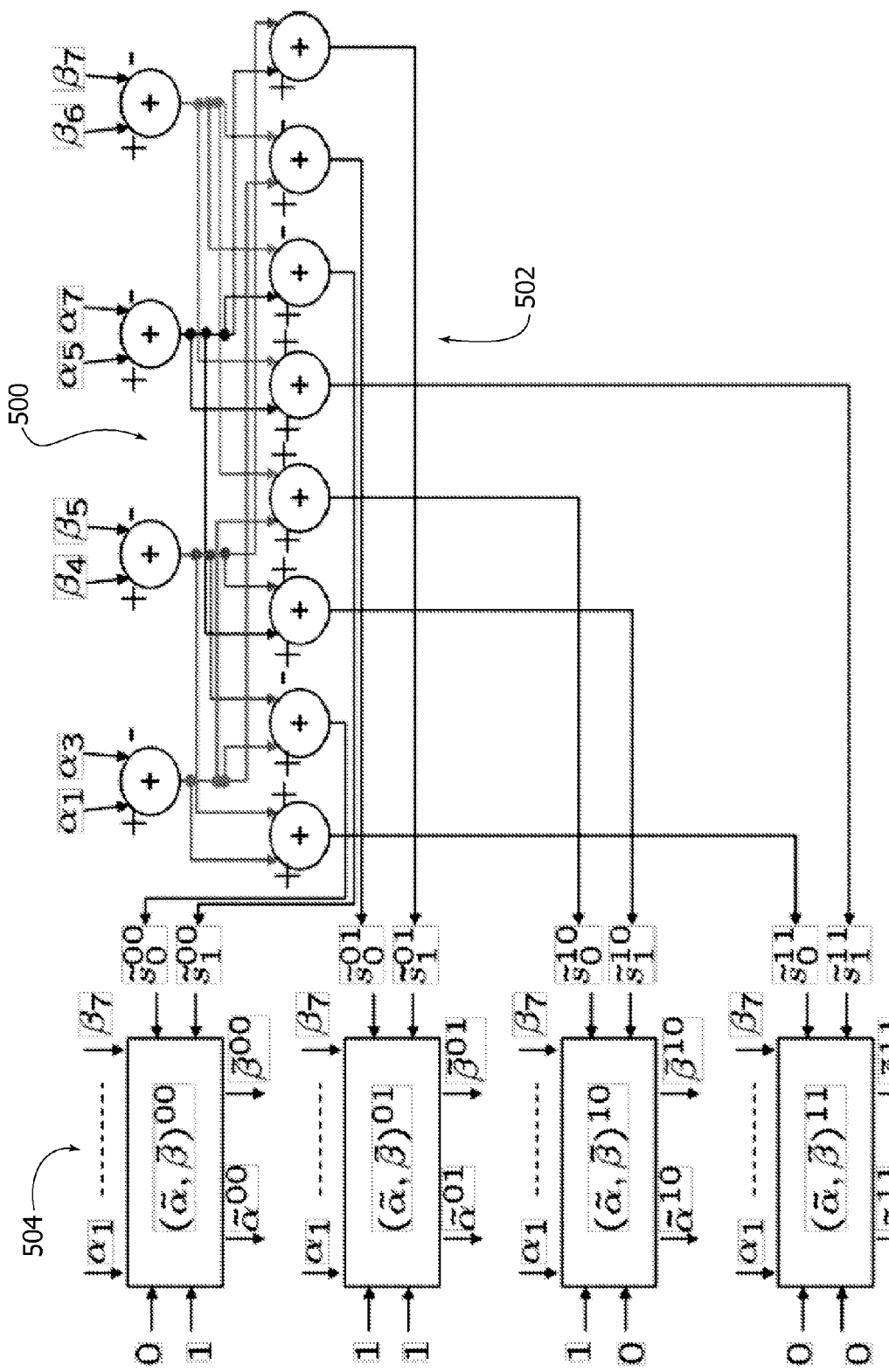
FIG. 6 is a block diagram showing possible details of tilde selection signals.

FIGS. 3 and 4 refer to hat selection, while FIGS. 5 and 6 refer to tilde selection.

Specifically, FIG. 3 refers to hat final selection and FIG. 4 refers to hat selection signals generation.

Similarly, FIG. 5 refers to tilde final selection and FIG. 6 to tilde selection signals generation.

In one or more embodiments as exemplified herein, the diagrams of FIGS. 3 and 5, on the one side, and the diagrams of FIGS. 4 and 6, one the other side, may be essentially dual.

Consequently, in the diagrams of FIGS. 3 and 5:

references 208 and 408 denote the top level of the final metric selector block for hat and tilde metrics respectively, fed with wrapped forward metrics $\alpha_k$, k=0, 1, . . . , 7, wrapped backward metrics $\beta_j$, j= 0, 1, . . . , 7 and selection signals;

references 200 and 400 denote first level selection stages (e.g., multiplexers), of the respective final metric selector blocks, fed with wrapped backward metrics $\beta_j$, j= 0, 1, . . . , 7;

references 202 and 402 denote second level selection stages, of the respective final metric selector blocks, fed with wrapped forward metrics $\alpha_k$, k=0, 1, . . . , 7 and the output from the first level selection stages 200 and 400;

references 204, 404 and 206, 406 denote further mux stages (204, 404) and cascaded adder stages (with sign—206, 406), of the respective final metric selector blocks, fed with the output from the second level selection stages 202 and 402.

Also, it will be appreciated that, in one or more embodiments, one of the inputs of the stages 204 and 404 may derive from the output of the stages 206 and 406.

Similarly, the diagrams of FIGS. 4 and 6, references 300 and 500 denote first level adder stages (with sign), of the respective selection signals generator blocks, fed with wrapped backward and forward metrics as indicated;

references 302 and 502 denote second level adder stages (with sign), of the respective selection signals generator blocks, fed with the output from the first level adder stages 300 and 500;

references 304 and 504 denote the top level of the final metric selector blocks (208 and 408) for hat and tilde metrics respectively with explicitation of the hat and tilde selection signals fed with wrapped backward and forward metrics as indicated and controlled by the outputs from the adder stages 302 and 502.

Throughout the diagrams of FIGS. 3 to 6, $s_0^x$, $s_1^x$, $s_2^x$, $s_3^x$ with hat and tilde, respectively, denote corresponding selection signals.

In one or more embodiments, the selection signals referred to as $\hat{s}_0^x, \hat{s}_1^x$ in FIG. 4 and $\tilde{s}_0^x, \tilde{s}_1^x$ in FIG. 6 may represent the most significant bit (the sign) of the value of the associated operation, where all the operations among wrapped metrics may be performed in wrapping mode (e.g., the differences of the wrapped metrics are computed by allowing wrapping and keeping separate the α and β wrapping worlds). For each value of x corresponding to an uncoded couple u, either hat or tilde (α, β) may include adding the extrinsic gamma branch metric $\gamma_1^E$.

In one or more embodiments one may extend $(\hat{\alpha}^x, \hat{\beta}^x)$ and $(\tilde{\alpha}^x, \tilde{\beta}^x)$ to the corresponding triplets $(\hat{\alpha}^x, \hat{\beta}^x, \hat{\gamma}^x)$ and $(\tilde{\alpha}^x, \tilde{\beta}^x, \tilde{\gamma}^x)$.

Figure 7:
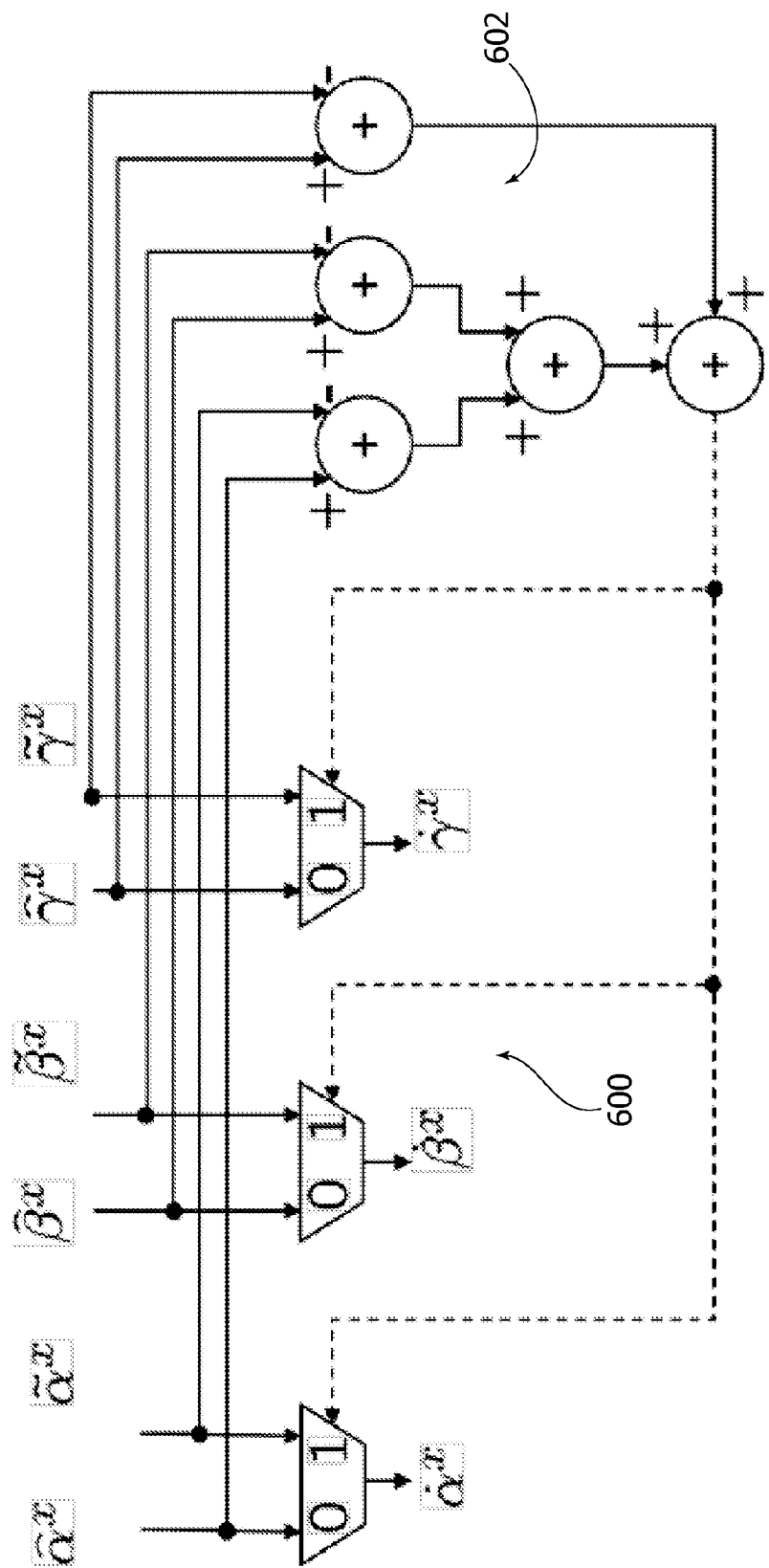
FIG. 7 is a block diagram showing an example of dot triplet selection.

Finally, extrinsic log-likelihood constituents $(\dot{\alpha}^x, \dot{\beta}^x, \dot{\gamma}^x)$ may be computed by comparing hat and tilde triplets corresponding to a same x as exemplified in FIG. 7, where references 600 and 602 denote selection stages and cascaded adder stages, respectively, fed with the elements from the triplets $(\hat{\alpha}^x, \hat{\beta}^x, \hat{\gamma}^x)$ and $(\tilde{\alpha}^x, \tilde{\beta}^x, \tilde{\gamma}^x)$.

These may be associated with the paths with maximum estimated reliability, with comparisons being still performed with wrapped differences and by keeping the α and β wrapping worlds separate.

Figure 8:
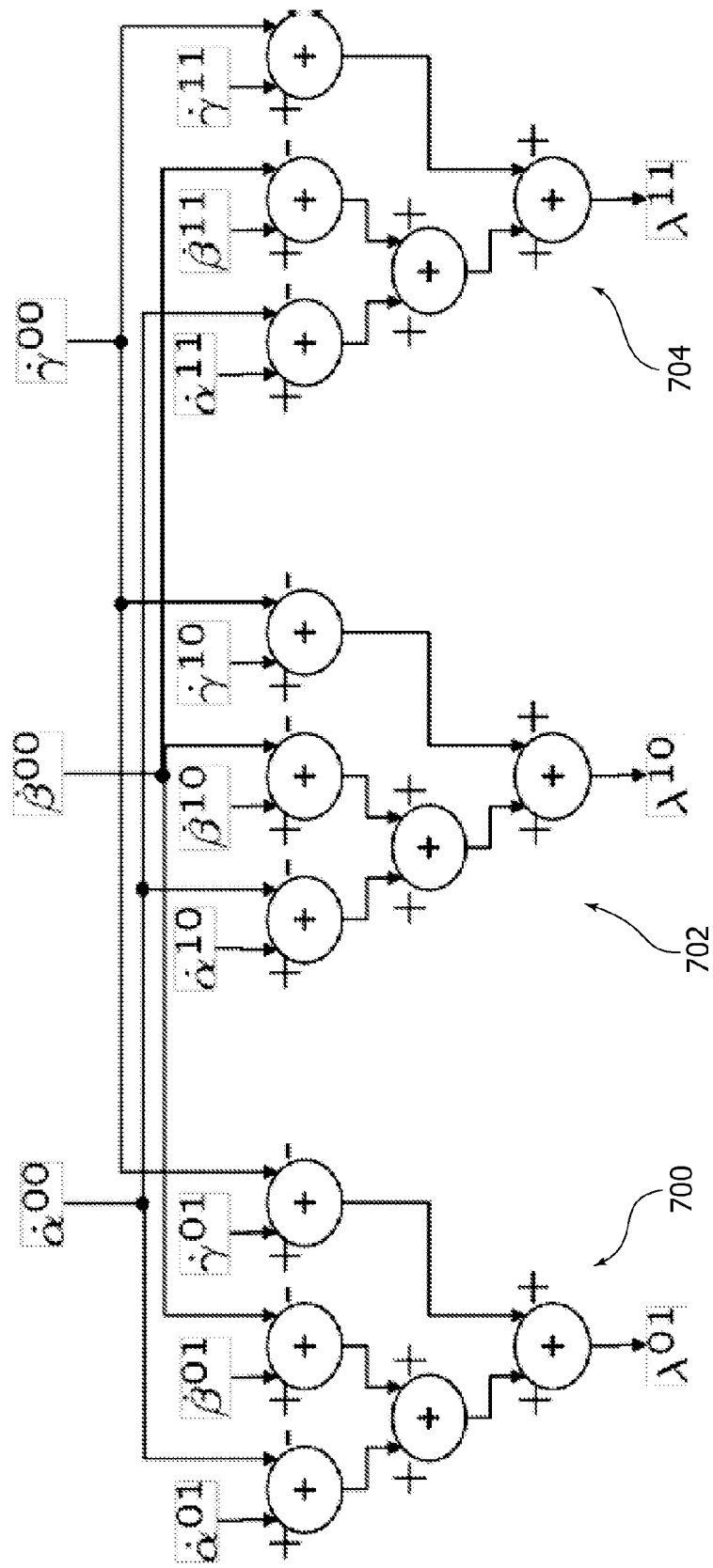
FIG. 8 is a block diagram showing the computation of extrinsic information.

From the extrinsic constituents, the extrinsic information ($\lambda^x$, x≠00) may be computed with wrapped differences and keeping the α and β wrapping worlds separate, as exemplified in FIG. 8, where references 700, 702 and 704 denote respective cascaded adder blocks (with sign) to produce extrinsic information $\lambda^{01}, \lambda^{10}$ and $\lambda^{11}$.

The following may be further noted in respect of one or more embodiments as exemplified in the foregoing:

As shown in FIG. 2, forward and backward state metrics feed the hat and tilde selection blocks. The hat (resp. tilde) selection block may rely on four hat (resp. tilde) final selection blocks, depicted in FIG. 4 (resp. 6), on four wrapped subtracters to compute $\alpha_{k,wrap} - \alpha_{h,wrap}$ and $\beta_{i,wrap} - \beta_{j,wrap}$ quantities (references 300 and 500) and on eight adders/subtracters to combine them (references 302 and 502).

As shown in FIG. 3 (resp. 5) each hat (resp. tilde) final selection block has two static selection signals $\hat{s}^u_2, \hat{s}^u_3$ ($\tilde{s}^u_2, \tilde{s}^u_3$), whose value depends only on u, and two dynamic selection signals $\hat{s}^u_0, \hat{s}^u_1$ ($\tilde{s}^u_0, \tilde{s}^u_1$), whose values are the sign of the adders/subtracters combining $\alpha_{k,wrap} - \alpha_{h,wrap}$ and $\beta_{i,wrap} - \beta_{j,wrap}$ quantities. The static selection generates a permutation of the beta metrics such that, together with the corresponding alpha metrics, they correspond to alpha/beta couples to produce the hat (tilde) subsets of each $s^u$. Then, each hat (tilde) block performs a two-round selection of the alpha/beta couples. The result of the first round depends on the dynamic selection signals, whereas the result of the second round depends on the alpha/beta couples selected in the first round. The hat (tilde) output couple is selected depending on the sign of the result obtained adding $\alpha'_{k,wrap} - \alpha'_{h,wrap}$ and $\beta'_{i,wrap} - \beta'_{j,wrap}$, where $\alpha'_{k,wrap}, \alpha'_{h,wrap}, \beta'_{i,wrap}$ and $\beta'_{j,wrap}$ are the couples selected in the first round. The same principle is depicted in FIG. 7 where the best alpha/beta/gamma triplet between hat and tilde ones is selected to obtain the dot triplet. Finally in FIG. 8, the three extrinsic information values are obtained combining the dot triplets, namely computing $\lambda^x = (\dot{\alpha}^x - \dot{\alpha}^{00}) + (\dot{\beta}^x - \dot{\beta}^{00}) + (\dot{\gamma}^x - \dot{\gamma}^{00})$, the differences in this equation being computed by allowing wrapping.

One or more embodiments may rely on the possibility of completely wrapping a chain of reliability metrics.

One or more embodiments may involve a process of comparing, e.g., two metrics respectively originated from operations on other primitive metrics, by omitting an exact computation the two metrics to be compared, with the result inferred from the primitive metrics.

In one or more embodiments, a wrapping technique may be adopted as an alternative to metric scaling or metric normalization in the context of decoding of convolutional codes.

One or more embodiments may optionally extend to procedures that involve a chain of (reliability) metrics.

One or more embodiments may require less logic for metric computation since normalization modules for keeping metrics constrained in a certain range may be dispensed with (this may also positively impact on the latency). By way of direct comparison a conventional HomePlug AV turbo decoder may require for extrinsic computation twenty-five addition/subtraction operations and twenty-one operations of finding the max of two quantities.

One or more embodiments as exemplified herein may employ twenty-one additions/subtractions performed without taking into account overflow problems and seven operations of finding the max of two quantities.

Of course, without prejudice to the principles of the embodiments, the details of construction and the embodiments may vary, even significantly, with respect to what is illustrated herein purely by way of non-limiting example.

Some embodiments may take the form of or include computer program products. For example, according to one embodiment there is provided a computer readable medium including a computer program adapted to perform one or more of the methods or functions described above. The medium may be a physical storage medium such as for example a Read Only Memory (ROM) chip, or a disk such as a Digital Versatile Disk (DVD-ROM), Compact Disk (CD-ROM), a hard disk, a memory, a network, or a portable media article to be read by an appropriate drive or via an appropriate connection, including as encoded in one or more barcodes or other related codes stored on one or more such computer-readable mediums and being readable by an appropriate reader device.

Furthermore, in some embodiments, some of the systems and/or modules and/or circuits and/or blocks may be implemented or provided in other manners, such as at least partially in firmware and/or hardware, including, but not limited to, one or more application-specific integrated circuits (ASICs), digital signal processors, discrete circuitry, logic gates, shift registers, standard integrated circuits, state machines, look-up tables, controllers (e.g., by executing appropriate instructions, and including microcontrollers and/or embedded controllers), field-programmable gate arrays (FPGAs), complex programmable logic devices (CPLDs), etc., as well as devices that employ RFID technology, and various combinations thereof.

The various embodiments described above can be combined to provide further embodiments. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method, comprising:
automatically producing from digital data signals a plurality of families of metrics, at least one family of the plurality of families allowing metric wrapping;
automatically computing a set of differences of metrics selected out of said plurality of families of metrics, the set of differences excluding differences between wrapping metrics of different families of the plurality of families of metrics;
automatically generating signals representative of order relationships of combinations of corresponding unwrapped metrics based on said set of differences; and
automatically decoding encoded data in the digital data signals based on the generated signals representative of order relationships.

2. The method of claim 1 wherein with $\alpha^I, \alpha^{II}, \ldots, \alpha^N$ being said families of metrics, $\alpha^I = \{\alpha_{k_I}^I, k_I \in K_I\}$, $\alpha^{II} = \{\alpha_{k_{II}}^{II}, k_{II} \in K_{II}\}, \ldots, \alpha^N = \{\alpha_{k_N}^N, k_N \in K_N\}$, $K_I, K_{II}, \ldots, K_N$ a set of indices with $|\alpha_{k_n}^n - \alpha_{h_n}^n| < D_{\alpha_n}/2 \forall k_n, h_n \in K_n, \forall n = I, II, \ldots N$, and $D_{\alpha_n}$ a family wrapping modulo, the method comprises:
allowing at least one metric in said families of metrics $\alpha^I, \alpha^{II}, \ldots, \alpha^N$ to wrap in a respective family wrapping interval, and
checking as a function of differences including wrapped metrics $$\sum_{n=I}^{N} [\alpha_{k_n,wrap}^n - \alpha_{h_n,wrap}^n]_{D_{\alpha_n}} > 0$$

if an order relationship $$\sum_{n=I}^{N} \alpha_{k_n}^n > \sum_{n=I}^{N} \alpha_{h_n}^n$$

exists between corresponding unwrapped metrics.

3. The method of claim 1 wherein said digital data signals are arranged in data blocks, each data block including a sequence of bit signals and being encoded with a convolutional code, the method comprising, for a data block:
producing for the data block a plurality of families of metrics, at least one family of the plurality of families allowing metric wrapping;
computing for the block a set of differences of metrics selected out of said plurality of families of metrics, the set of differences of metrics for the block excluding differences between wrapping metrics of different families of the plurality of families of metrics for the block;
computing extrinsic information for the block as a function of said set of differences of said metrics for the block; and
decoding the block based on said extrinsic information for the block.

4. The method of claim 3 wherein said data blocks are encoded with a turbo code.

5. The method of claim 3 wherein computing extrinsic information for the block includes selecting dot triplets as a function of said set of differences of said metrics for the block and computing extrinsic information from said dot triplets.

6. The method of claim 3 wherein computing extrinsic information for the block includes combining a set of extrinsic log-likelihood constituents.

7. The method of claim 3 including producing metrics selected out of:
present metrics;
branch metrics;
past metrics;
forward metrics;
future metrics;
backward metrics;
a posteriori metrics; and
extrinsic metrics.

8. A device, comprising:
an input configured to receive digital data signals;
digital signal processing circuitry configured to:
produce from digital data signals a plurality of families of metrics, at least one family of the plurality of families allowing metric wrapping;
compute a set of differences of metrics selected out of said plurality of families of metrics, the set of differences excluding differences between wrapping metrics of different families of the plurality of families of metrics;
generate signals representative of order relationships of combinations of corresponding unwrapped metrics based on said set of differences; and
decode the digital data signals based on the generated signals representative of order relationships.

9. The device of claim 8 wherein, with $\alpha^I, \alpha^{II}, \ldots, \alpha^N$ being said families of metrics, $\alpha^I = \{\alpha_{k_I}^I, k_I \in K_I\}$, $\alpha^{II} = \{\alpha_{k_{II}}^{II}, k_{II} \in K_{II}\}, \ldots, \alpha^N = \{\alpha_{k_N}^N, k_N \in K_N\}$, $K_I, K_{II}, \ldots, K_N$ a set of indices with $|\alpha_{k_n}^n - \alpha_{h_n}^n| < D_{\alpha_n}/2 \forall k_n, h_n \in K_n, \forall n = I, II, \ldots N$, and $D_{\alpha_n}$ a family wrapping modulo, the digital signal processing circuitry is configured to:
allow at least one metric in said families of metrics $\alpha^I, \alpha^{II}, \ldots, \alpha^N$ to wrap in a respective family wrapping interval, and
check as a function of differences including wrapped metrics $$\sum_{n=I}^{N} [\alpha_{k_n,wrap}^n - \alpha_{h_n,wrap}^n]_{D_{\alpha_n}} > 0$$

if an order relationship $$\sum_{n=I}^{N} \alpha_{k_n}^n > \sum_{n=I}^{N} \alpha_{h_n}^n$$

exists between corresponding unwrapped metrics.

10. The device of claim 8 wherein said digital data signals are arranged in data blocks, each data block including a sequence of bit signals and being encoded with a convolutional code, and the digital signal processing circuitry is configured to process a data block by:
producing for the data block a plurality of families of metrics, at least one family of the plurality of families allowing metric wrapping;
computing for the block a set of differences of metrics selected out of said plurality of families of metrics, the set of differences of metrics for the block excluding differences between wrapping metrics of different families of the plurality of families of metrics for the block;
computing extrinsic information for the block as a function of said set of differences of said metrics for the block; and decoding the block based on said extrinsic information for the block.

11. The device of claim 10 wherein said data blocks are encoded with a turbo code.

12. The device of claim 10 wherein the digital signal processing circuitry is configured to select dot triplets as a function of said set of differences of said metrics for the block and compute extrinsic information from said dot triplets.

13. The device of claim 10 wherein the digital signal processing circuitry is configured to combine a set of extrinsic log-likelihood constituents.

14. The device of claim 8 wherein the digital signal processing circuitry comprises:
   a plurality of selectors configured to select metrics out of said plurality of families of metrics; and
   computation circuitry configured to generate extrinsic information based on the metrics selected by the plurality of selectors.

15. A system, comprising:
   a plurality of selectors configured to:
      select metrics out of a plurality of families of metrics produced from digital data signals, at least one family of the plurality of families of metrics allowing metric wrapping; and
      compute a set of differences of metrics selected out of said plurality of families of metrics, the set of differences excluding differences between wrapping metrics of different families of the plurality of families of metrics;
   circuitry configured to generate signals representative of order relationships of combinations of corresponding unwrapped metrics based on said set of differences; and
   decoding circuitry configured to decode the digital data signals based on the generated signals representative of order relationships.

16. The system of claim 15 wherein, with $\alpha^I, \alpha^{II}, \ldots, \alpha^N$ being said families of metrics, $\alpha^I = \{\alpha_{k_I}^I, k_I \in K_I\}$, $\alpha^{II} = \{\alpha_{k_{II}}^{II}, k_{II} \in K_{II}\}, \ldots, \alpha^N = \{\alpha_{k_N}^N, k_N \in K_N\}$, $K_I, K_{II}, \ldots, K_N$ a set of indices with $|\alpha_{k_n}^n - \alpha_{h_n}^n| < D_{\alpha_n}/2 \forall k_n, h_n \in K_n, \forall n = I, II, \ldots N$, and $D_{\alpha_n}$ a family wrapping modulo, at least one metric in said families of metrics $\alpha^I, \alpha^{II}, \ldots, \alpha^N$ allowed to wrap in a respective family wrapping interval, the circuitry configured to generate signals representative of order relationships is configured to:
   check as a function of differences including wrapped metrics $$\sum_{n=I}^{N} [\alpha_{k_n, wrap}^n - \alpha_{h_n, wrap}^n]_{D_{\alpha_n}} > 0$$

if an order relationship $$\sum_{n=I}^{N} \alpha_{k_n}^n > \sum_{n=I}^{N} \alpha_{h_n}^n$$

exists between corresponding unwrapped metrics.

17. The system of claim 15 wherein the plurality of selectors are configured to process metrics produced from blocks of data encoded with a convolutional code.

18. A non-transitory computer-readable medium having contents which configure a digital signal decoder to perform a method, the method comprising:
   producing from digital data signals a plurality of families of metrics, at least one family of the plurality of families of metrics allowing metric wrapping;
   computing a set of differences of metrics selected out of said plurality of families of metrics, the set of differences excluding differences between wrapping metrics of different families of the plurality of families of metrics;
   generating signals representative of order relationships of combinations of corresponding unwrapped metrics based on said set of differences; and
   decoding the digital data signals based on the generated signals representative of order relationships.

19. The medium of claim 18 wherein with $\alpha^I, \alpha^{II}, \ldots, \alpha^N$ being said families of metrics, $\alpha^I = \{\alpha_{k_I}^I, k_I \in K_I\}$, $\alpha^{II} = \{\alpha_{k_{II}}^{II}, k_{II} \in K_{II}\}, \ldots, \alpha^N = \{\alpha_{k_N}^N, k_N \in K_N\}$, $K_I, K_{II}, \ldots, K_N$ a set of indices with $|\alpha_{k_n}^n - \alpha_{h_n}^n| < D_{\alpha_n}/2 \forall k_n, h_n \in K_n, \forall n = I, II, \ldots N$, and $D_{\alpha_n}$ a family wrapping modulo, the method comprises:
   allowing at least one metric in said families of metrics $\alpha^I, \alpha^{II}, \ldots, \alpha^N$ to wrap in a respective family wrapping interval, and
   checking as a function of differences including wrapped metrics $$\sum_{n=I}^{N} [\alpha_{k_n, wrap}^n - \alpha_{h_n, wrap}^n]_{D_{\alpha_n}} > 0$$

if an order relationship $$\sum_{n=I}^{N} \alpha_{k_n}^n > \sum_{n=I}^{N} \alpha_{h_n}^n$$

exists between corresponding unwrapped metrics.

20. The medium of claim 18 wherein said digital data signals are arranged in data blocks, each data block including a sequence of bit signals and being encoded with a convolutional code, the method comprising, for a data block:
   producing for the data block a plurality of families of metrics, at least one family of the plurality of families allowing metric wrapping;
   computing for the block a set of differences of metrics selected out of said plurality of families of metrics, the set of differences of metrics for the block excluding differences between wrapping metrics of different families of the plurality of families of metrics for the block;
   computing extrinsic information for the block as a function of said set of differences of said metrics for the block; and
   decoding the block based on said extrinsic information for the block.

21. The medium of claim 20 wherein computing extrinsic information for the block includes selecting dot triplets as a function of said set of differences of said metrics for the block and computing extrinsic information from said dot triplets.

* * * * *